United States Patent
Sharma et al.

(10) Patent No.: US 12,068,048 B2
(45) Date of Patent: Aug. 20, 2024

(54) PROCESSING SYSTEM ERROR MANAGEMENT, RELATED INTEGRATED CIRCUIT, APPARATUS AND METHOD

(71) Applicants: STMicroelectronics Application GMBH, Aschheim-Dornach (DE); STMicroelectronics International N.V., Geneva (CH)

(72) Inventors: Vivek Mohan Sharma, New Delhi (IN); Roberto Colombo, Munich (DE)

(73) Assignees: TMicroelectronics Application GMBH, Aschheim-Dornach (DE); STMicroelectronics International N.V., Geneva (CH)

( * ) Notice: Subject to any disclaimer, the term of this patent is extended or adjusted under 35 U.S.C. 154(b) by 202 days.

(21) Appl. No.: 17/815,807

(22) Filed: Jul. 28, 2022

(65) Prior Publication Data

US 2023/0065623 A1 Mar. 2, 2023

(30) Foreign Application Priority Data

Aug. 31, 2021 (IT) .................. 102021000022565

(51) Int. Cl.
| | |
|---|---|
| *G11C 29/24* | (2006.01) |
| *G11C 29/36* | (2006.01) |
| *G11C 29/42* | (2006.01) |
| *G11C 29/48* | (2006.01) |

(52) U.S. Cl.
CPC .............. *G11C 29/42* (2013.01); *G11C 29/36* (2013.01); *G11C 29/48* (2013.01); *G11C 2029/3602* (2013.01)

(58) Field of Classification Search
CPC .......... G11C 11/401; G11C 2029/0401; G11C 29/44; G11C 29/4401; G11C 29/848; G11C 2029/3602; G11C 29/36; G11C 29/42; G11C 29/48; G11C 11/221; G11C 11/2273; G11C 11/2275; G11C 11/4093; G11C 29/52; G11C 7/1006
See application file for complete search history.

(56) References Cited

U.S. PATENT DOCUMENTS

| | | |
|---|---|---|
| 8,381,083 B2 | 2/2013 | Wezelenburg et al. |
| 2005/0044467 A1* | 2/2005 | Leung ................. G06F 11/1048 |
| | | 714/E11.049 |
| 2014/0250340 A1 | 9/2014 | Cordero et al. |

FOREIGN PATENT DOCUMENTS

EP 3534261 A1 9/2019

OTHER PUBLICATIONS

"Error detection and correction" of Wikipedia, e.g., the version of May 6, 2021, 11 pages.

(Continued)

*Primary Examiner* — Thong Q Le
(74) *Attorney, Agent, or Firm* — Slater Matsil, LLP

(57) ABSTRACT

A processing system includes an error detection circuit configured to receive data bits and ECC bits, calculate further ECC bits as a function of the data bits, and generate a syndrome by comparing the calculated ECC bits with the received ECC bits. When the syndrome corresponds to one of N+K single bit-flip reference syndromes, the error detection circuit asserts a first error signal, and asserts one bit of a bit-flip signature corresponding to a single bit-flip error indicated by the respective single bit-flip reference syndrome.

20 Claims, 8 Drawing Sheets

(56) References Cited

OTHER PUBLICATIONS

Xilinx, Application Note XAPP383 "Single Error Correction and Double Error Detection (SECDED) with CoolRunner-II CPLDs", v1.1, Aug. 1, 2003, 4 pages.

* cited by examiner

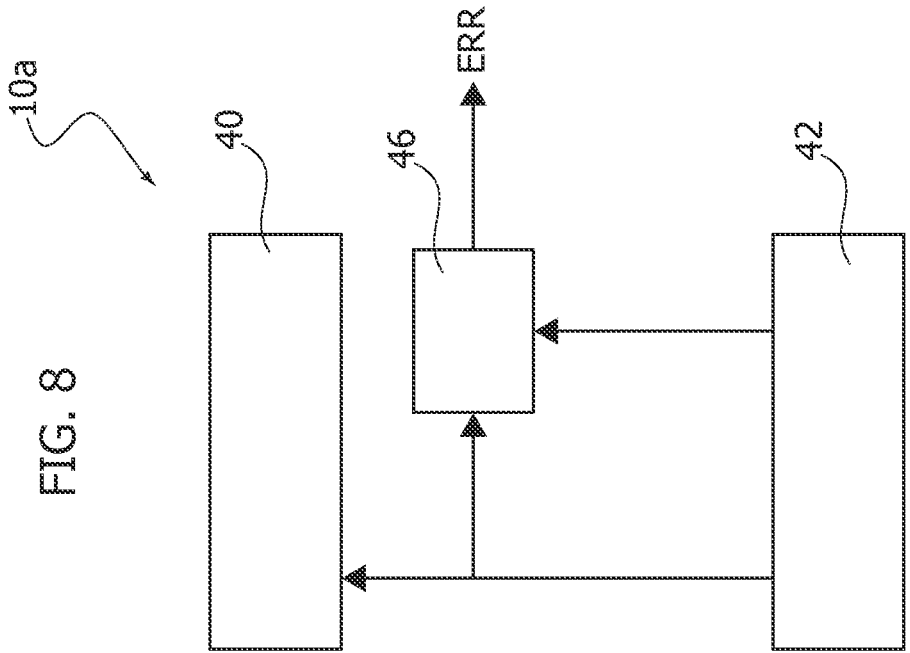
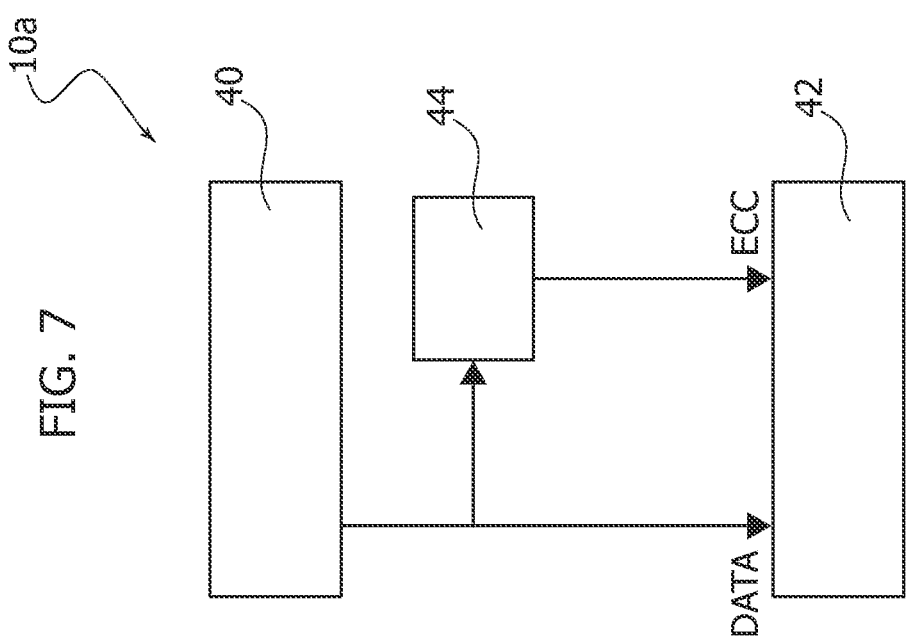

PROCESSING SYSTEM ERROR MANAGEMENT, RELATED INTEGRATED CIRCUIT, APPARATUS AND METHOD

CROSS-REFERENCE TO RELATED APPLICATIONS

This application claims the priority benefit of Italian patent application number 102021000022565, filed on Aug. 31, 2021, entitled "Processing system, related integrated circuit, device and method," which is hereby incorporated herein by reference to the maximum extent allowable by law.

TECHNICAL FIELD

Embodiments of the present disclosure relate to error management within processing systems, such as micro-controllers.

BACKGROUND

FIG. 1 shows a typical electronic system, such as the electronic system of a vehicle, comprising a plurality of processing systems 10, such as embedded systems or integrated circuits, e.g., a Field Programmable Gate Array (FPGA), a Digital Signal Processor (DSP) or a micro-controller (e.g., dedicated to the automotive market).

For example, in FIG. 1 are shown three processing systems $10_1$, $10_2$ and $10_3$ connected through a suitable communication system 20. For example, the communication system may include a vehicle control bus, such as a Controller Area Network (CAN) bus, and possibly a multimedia bus, such as a Media Oriented Systems Transport (MOST) bus, connected to vehicle control bus via a gateway. Typically, the processing systems 10 are located at different positions of the vehicle and may include, e.g., an Engine Control Unit, a Transmission Control Unit (TCU), an Antilock Braking System (ABS), a Body Control Module (BCM), and/or a navigation and/or multimedia audio system. Accordingly, one or more of the processing systems 10 may also implement real-time control and regulation functions. These processing systems are usually identified as Electronic Control Units.

FIG. 2 shows a block diagram of an exemplary digital processing system 10, such as a micro-controller, which may be used as any of the processing systems 10 of FIG. 1.

In the example considered, the processing system 10 comprises a microprocessor 102, usually the Central Processing Unit (CPU), programmed via software instructions. Usually, the software executed by the microprocessor 102 is stored in a non-volatile program memory 104, such as a Flash memory or EEPROM. Thus, the memory 104 is configured to store the firmware of the processing unit 102, wherein the firmware includes the software instructions to be executed by the microprocessor 102. Generally, the non-volatile memory 104 may also be used to store other data, such as configuration data, e.g., calibration data.

The microprocessor 102 usually has associated also a volatile memory 104b, such as a Random-Access-Memory (RAM). For example, the memory 104b may be used to store temporary data.

As shown in FIG. 2, usually the communication with the memories 104 and/or 104b is performed via one or more memory controllers 100. The memory controller(s) 100 may be integrated in the microprocessor 102 or connected to the microprocessor 102 via a communication channel, such as a system bus of the processing system 10. Similarly, the memories 104 and/or 104b may be integrated with the microprocessor 102 in a single integrated circuit, or the memories 104 and/or 104b may be in the form of a separate integrated circuit and connected to the microprocessor 102, e.g., via the traces of a printed circuit board.

In the example considered, the microprocessor 102 may have associated one or more (hardware) resources/peripherals 106 selected from the group of:

one or more communication interfaces IF, e.g., for exchanging data via the communication system 20, such as a Universal asynchronous receiver/transmitter (UART), Serial Peripheral Interface Bus (SPI), Inter-Integrated Circuit ($I^2C$), Controller Area Network (CAN) bus, and/or Ethernet interface, and/or a debug interface; and/or one or more analog-to-digital converters AD and/or digital-to-analog converters DA; and/or one or more dedicated digital components DC, such as hardware timers and/or counters, or a cryptographic co-processor; and/or one or more analog components AC, such as comparators, sensors, such as a temperature sensor, etc.; and/or one or more mixed signal components MSC, such as a PWM (Pulse-Width Modulation) driver.

Generally, a dedicated digital components DC may also correspond to a FPGA integrated in the processing system 10. For example, in this case, the memory 104 may also comprise the program data for such a FPGA.

Accordingly, the digital processing system 10 may support different functionalities. For example, the behavior of the microprocessor 102 is determined by the firmware stored in the memory 104, e.g., the software instructions to be executed by a microprocessor 102 of a micro-controller 10. Thus, by installing a different firmware, the same hardware (micro-controller) can be used for different applications.

In this respect, future generation of such processing systems 10, e.g., micro-controllers adapted to be used in automotive applications, are expected to exhibit an increase in complexity, mainly due to the increasing number of requested functionalities (new protocols, new features, etc.) and to the tight constraints of execution conditions (e.g., lower power consumption, increased calculation power and speed, etc.).

For example, recently more complex multi-core processing systems 10 have been proposed. For example, such multi-core processing systems may be used to execute (in parallel) several of the processing systems 10 shown in FIG. 1, such as several ECUs of an apparatus such as a vehicle.

FIG. 3 shows an example of a multi-core processing system 10. Specifically, in the example considered, the processing system 10 comprises a plurality of n processing cores $102_1 \ldots 102_n$ connected to a (on-chip) communication system 114. For example, in the context of real-time control systems, the processing cores $102_1 \ldots 102_n$ may be ARM Cortex®-R52 cores. Generally, the communication system 114 may comprise one or more bus systems, e.g., based on the Advanced eXtensible Interface (AXI) bus architecture, and/or a Network-on-Chip (NoC).

For example, as shown at the example of the processing core $102_1$, each processing core 102 may comprise a microprocessor 1020 and a communication interface 1022 configured to manage the communication between the microprocessor 1020 and the communication system 114. Typically, the interface 1022 is a master interface configured to forward a given (read or write) request from the microprocessor 1020 to the communication system 114, and forward an optional response from the communication system 114 to the microprocessor 1020. However, the communication interface 1022 may also comprise a slave interface. For example, in this way, a first microprocessor 1020 may send a request to a second microprocessor 1020 (via the communication interface 1022 of the first microprocessor, the communication system 114 and the communication interface 1022 of the second microprocessor).

Generally, each processing core $102_1 \ldots 102_n$ may also comprise further local resources, such as one or more local memories 1026, usually identified as Tightly Coupled Memory (TCM).

As mentioned before, typically the processing cores $102_1 \ldots 102_n$ are arranged to exchange data with a non-volatile memory 104 and/or a volatile memory 104b. In a multi-core processing system 10, often these memories are system memories, i.e., shared for the processing cores $102_1 \ldots 102_n$. As mentioned before, each processing core $102_1 \ldots 102_n$ may, however, comprise one or more additional local memories 1026.

For example, as shown in FIG. 3, the processing system 10 may comprise one or more memory controllers 100 configured to connect at least one non-volatile memory 104 and at least one volatile memory 104b to the communication system 114. As mentioned before, one or more of the memories 104 and/or 104b may be integrated in the integrated circuit of the processing system 10 or connected externally to the integrated circuit.

As mentioned before, the processing system 10 may comprise one or more resources 106, such as one or more communication interfaces or co-processors (e.g., a cryptographic co-processor). The resources 106 are usually connected to the communication system 114 via a respective communication interface 1062. In general, the communication interface 1062 comprises at least a slave interface. For example, in this way, a processing core 102 may send a request to a resource 106 and the resource returns given data. Generally, one or more of the communication interfaces 1062 may also comprise a respective master interface. For example, such a master interface may be useful in case the resource has to start a communication in order to exchange data via (read and/or write) request with another circuit connected to the communication system 114, such as a resource 106 or a processing core 102. For example, for this purpose, the communication system 114 may indeed comprise an Advanced Microcontroller Bus Architecture (AMBA) High-performance Bus (AHB), and an Advanced Peripheral Bus (APB) used to connect the resources/peripherals 106 to the AMBA AHB bus.

Often such processing systems 10 comprise also one or more Direct Memory Access (DMA) controllers 110. For example, as shown in FIG. 3, a DMA controller no may be used to directly exchange data with a memory, e.g., the memory 104b, based on requests received from a resource 106. For example, in this way, a communication interface IF may directly read data (via the DMA controller 110) from the memory 104b and transmit these data, without having to exchange further data with a processing unit 102. Generally, a DMA controller no may communicate with the memory or memories via the communication system 114 or via one or more dedicated communication channels.

In this respect, irrespective of the complexity of the processing system 10 (e.g., with respect to the number of processing cores 102 and/or number and type of the resources 106), a typical processing system 10 comprises also fault collection and error management circuit 120.

For example, European patent application n. EP 3 534 261 A1 discloses possible embodiments of a fault collection and error management circuit 120, which is incorporated herein by reference for this purpose.

Specifically, as shown in FIG. 4, at least one of the circuits 102, 104 and 106 may generate one or more error signals $ERR_1, \ldots, ERR_m$. For example, such error signals ERR may be generated by at least one of:

a memory 104 supporting an error detection and optional correction function, which generates an error signal $ERR_1$, when the data read from the memory 104 contain errors and/or when data could not be written to the memory;

a processing core 102 configured to generate an error signal $ERR_2$ in response to a hardware and/or software failure; and a communication interface configured to generate an error signal $ERR_3$, corresponding to a hard error signal indicative of a hardware failure and/or a soft error signal indicative of a data transmission error.

In the example considered, the various error signals $ERR_1, \ldots, ERR_m$ are provided to the fault collection and error management circuit 120. In response to the error signals $ERR_1, \ldots, ERR_m$, the fault collection and error management circuit 120 may execute various operations.

For example, the fault collection and error management circuit 120 may be configured to generate at least one of:

an interrupt signal IRQ provided to a processing core 102;

a reset request signal RST provided to a reset management circuit of the processing system 10;

a signal ET provided to a terminal EP of the processing system 10, e.g., in order to signal the error to an external circuit; and a signal SET used to set the output level of one or more safety critical terminals SCP of the processing system 10.

Specifically, due to an error, the circuits of the processing system 10 may not operate correctly, possibly generating incorrect signals at the pins/pads of the processing system 10. Some of the pins/pads of the processing system boa may thus be safety-critical pins/pad, i.e., pins/pads which may generate critical situations when driven incorrectly. For example, in FIG. 4 is shown schematically a first safety-critical pin $SCP_2$, which is driven by a processing core 102, and a second safety-critical pin $SCP_2$, which is driven by a resource/peripheral 106, such as a communication interface or a PWM half-bridge driver.

Generally, each input/output pin/pad of the processing system 10 has usually associated a respective driver circuit IO, which is configured to drive the respective pin/pad as a function of the signal received from the respective block, e.g., the processing system 102 and the hardware resources 106. Generally, between the driver circuits IO and the blocks of the processing system ma may also be arranged a dedicated logic, such as one or more multiplexers, permitting a configuration of the pin-mapping.

Accordingly, in line with the disclosure of document EP 3 534 261 A1, the driver circuit IO of a safety-critical pins/pads SCP may be configured to set the output level of the respective pin to a given safety state in response to a signal SET. The output level, such as a high-impedance state or a given logic level (high or low), may depend on the specific application needs. Preferably such a "safety state" is compliant to the ISO2626 specification.

FIG. 5 shows a possible implementation of the fault collection and error management circuit 120.

In the example considered, the fault collection and error management circuit 120 comprises a register 1200. Specifically, in the example considered, the register 1200 comprises one or more error bits EB for storing the value of the error signals ERR. For example, considering the exemplary case of three error signals $ERR_1 \ldots ERR_3$, the register 1200 may comprise a corresponding number of error bits EB.

In the example considered, the fault collection and error management circuit 120 comprises an internal reaction circuit 1202. Specifically, the internal reaction circuit 1202 may be configured to generate the interrupt signal IRQ and/or the reset request signal RST as a function of the content of the error bits EB of the register 1200. The error bits EB are purely optional and the external reaction circuit 1202 may generate the interrupt signal IRQ and/or the reset request signal RST also directly as a function of the error signal(s) ERR.

Similarly, the fault collection and error management circuit 120 comprises an external reaction circuit 1204. Specifically, the external reaction circuit 1204 may be configured to generate the error trigger signal ET and/or the signal SET as a function of the content of the error bits EB of the register 1200. Again, the error bits EB are purely optional and the external reaction circuit 1204 may generate the signal ET and/or the signal SET also directly as a function of the error signal(s) ERR.

In general, the behavior of the reaction circuits 1202 and/or 1204 may also be programmable, e.g., by setting one or more configuration bits in the register 1200. For example, in the example considered, the register 1200 comprises:

a respective interrupt enable bit IE for each of the error signals $ERR_1 \ldots ERR_3$, i.e., the interrupt signal IRQ is asserted when also the respective interrupt enable bit IE of an asserted error signal ERR is asserted;

a respective error trigger enable bit ETE for each of the error signals $ERR_1 \ldots ERR_3$, i.e., the error trigger signal ET is asserted when also the respective error trigger enable bit ETE of an asserted error signal ERR is asserted.

Similarly, the register 1200 may comprise respective reset enable bits for the reset request signal REQ and/or respective enable bits for the safety signal SET.

In order to simplify the data exchange between the processing unit 102 and the registers 1200, the register 1200 may be directly addressable by the processing unit 102, which is schematically shown in FIG. 3, where the fault collection and error management circuit 120 is connected to the communication system 114.

Typically, as shown in FIG. 6, the hardware error signals ERR are generated by dedicated safety monitor circuits SM. For example, such safety monitor circuits may comprise combinational and/or sequential logic circuits, which monitor the operation of a given circuit. Generally, such safety monitor circuits SM may also comprise analog components, e.g., in order to detect an out-of-range condition for an analog signal, such as an internal supply voltage or a signal indicative of the operating temperature of the processing system or a specific circuit of the processing system.

For example, FIG. 6 shows a safety monitor circuit $SM_{104}$ configured to monitor one or more signals of the memory 104, a safety monitor circuit $SM_{102}$ configured to monitor one or more signals of a processing core 102 and a safety monitor circuit $SM_{106}$ configured to monitor one or more signals of a resource/peripheral 106. Generally, the safety monitor circuit may also be integrated in the respective circuit.

Accordingly, typically each safety monitor circuit SM monitors one or more signals generated by and/or provided to the associated circuit, and determines whether the behavior of the signal(s) is normal or indicates an error. In general, the operations performed by a given safety monitor circuit SM depend on the associated circuit and may include, e.g.:

a combinational analysis, e.g., by combining the signals of the associated circuit in order to determine whether the signal levels are congruent;

a sequential analysis, e.g., by comparing the time evolution of one or more signals with one or more reference signals;

an analysis of one or more analog signals, e.g., by comparing the value of an analog signal with one or more reference values; or a combination of the above analyses in order to implement a more complex abnormal behavior analysis.

For example, the safety monitor circuit $SM_{104}$ may comprise an error detection circuit of the memory 104, which calculates (via combinational and optionally sequential logic operations) an error correction code for the data read from the memory and compares (via combinational logic operations) the calculated error correction code with an error correction code read from the memory.

Accordingly, in response to determining an abnormal behavior, the safety monitor circuit SM may assert a respective error signal ERR, which signals the error to the fault collection system 120.

In view of the foregoing, it is clear that also the safety monitor circuits may be complex circuits, which may be subject to malfunctions. This applies in particular to safety monitor circuits for memories or other safety monitor circuits comprising a circuit configured to verify an error correction code (ECC).

SUMMARY

In view of the above, it is an objective of various embodiments of the present disclosure to provide solutions for monitoring the operation of a safety monitor circuit comprising a circuit configured to verify an error correction code (ECC).

According to one or more embodiments, one or more of the above objectives is achieved by means of a processing system having the features specifically set forth in the claims that follow. Embodiments moreover concern a related integrated circuit, apparatus and method.

The claims are an integral part of the technical teaching of the disclosure provided herein.

As mentioned before, various embodiments of the present disclosure relate to a processing system, e.g., implemented in an integrated circuit, such as a microcontroller. Specifically, the processing system comprises a circuit configured to provide a given number N of data bits and a given number K of Error Correction Code (ECC) bits. The circuit has associated or comprises an error detection circuit.

Specifically, in various embodiments, the error detection circuit is configured to receive the data bits and the ECC bits. Next, the error detection circuit calculates further ECC bits as a function of the data bits according to the used ECC code. In various embodiments, the ECC code is adapted to correct up to a given maximum number of incorrect bits. For example, in various embodiments, the ECC code may be a Single-Error Correct (SEC) Double-Error Detect (DED) Code.

In various embodiments, the error detection circuit generates then a syndrome by comparing the calculated ECC bits with the received ECC bits, wherein the syndrome has K bits. Accordingly, the error detection circuit may compare the syndrome with a plurality of reference syndromes indicative of correctable errors. Specifically, the error detection circuit is configured to compare the syndrome at least with N+K single bit-flip reference syndromes, wherein each single bit-flip reference syndrome is associated with a respective single bit-flip error. Accordingly, in response to determining that the syndrome corresponds to a single bit-flip reference syndrome, the error detection circuit may assert a first error signal, e.g., indicative of a correctable error. Moreover, the error detection circuit may assert one bit of a bit-flip signature corresponding to the single bit-flip error indicated by the respective single bit-flip reference syndrome. Accordingly, the bit-flip signature has a given number N+K bits and indicates the position of one or more incorrect bits in the data bits and ECC bits.

For example, in various embodiments, the circuit may comprise an error correction circuit. Specifically, when the first error signal is asserted, the error correction circuit may generate corrected data bits by inverting each bit of the data bits for which the corresponding bit of the bit-flip signature is asserted.

Accordingly, the circuit may be, for example, a memory controller of the processing system. Specifically, such a memory controller may receive a read request from a microprocessor and/or a DMA controller of the processing system, wherein the read request comprising a given address. Accordingly, the memory controller may read the given number N of data bits and the given number K of ECC bits from the given address associated with a memory handled by the memory controller. When the first error signal is de-asserted, the memory controller may then provide the data bits to the microprocessor and/or the DMA controller. Conversely, when the first error signal is asserted, the memory controller may provide the corrected data bits to the microprocessor and/or the DMA controller.

In various embodiments, the processing system further comprises a test circuit configured to provide, during a test-mode, a sequence of patterns to the error detection circuit, each pattern comprising data bits and ECC bits, and monitor the respective first error signal and bit-flip signature.

Specifically, in various embodiments, the test circuit is configured to obtain a first pattern, the first pattern corresponding to a given sequence of data bits and ECC bits calculate as a function of the data bits according to the used ECC code/scheme, i.e., the first pattern does not comprise ECC errors. For example, the first pattern may be hard-wired or programmable. Next, the test circuit provides the first pattern to the error detection circuit and verifies whether the first error signal is de-asserted and all bits of the bit-flip signature are de-asserted. Accordingly, the test circuit may assert one or more error signals in response to determining that the first error signal is asserted and/or at least one bit of the bit-flip signature is asserted.

In various embodiments, the test circuit obtains a sequence of N+K further bit-flip signatures, each further bit-flip signature having asserted a single bit. Moreover, the test circuit obtains for each further bit-flip signature a respective second pattern, wherein each second pattern corresponds to a pattern having a single bit flipped with respect to a reference pattern at the positions of the single asserted bit of the respective further bit-flip signature. The reference pattern corresponds to a given sequence of data bits and ECC bits calculate as a function of the respective data bits according to the given ECC scheme, wherein each second pattern corresponds to a pattern with a correctable single bit error. For example, the reference pattern for the second patterns may corresponds to the first pattern.

In various embodiments, the test circuit is configured to generate the N+K second patterns, e.g., via a sequential logic circuit, by performing the following steps for each second pattern. First, the test circuit obtains the reference pattern and generates the respective further bit-flip signature, wherein the further bit-flip signature has asserted a single bit. Next, the test circuit generates the respective second pattern by inverting the bit of the reference pattern for which the corresponding bit of the further bit-flip signature is asserted. For example, the test circuit may generate such further bit-flip signature via a counter and a one-hot decoder, or a shift register having a single bit asserted. Accordingly, in various embodiments, the single bit is positioned in all possible positions of the bit-flip signature, i.e., N+K second patterns are provided to the error detection circuit.

In various embodiments, the test circuit provides each second pattern to the error detection circuit and verifies whether the first error signal is asserted and the bit-flip signature corresponds to the respective further bit-flip signature. Accordingly, the test circuit may assert one or more error signals in response to determining that the first error signal is de-asserted and/or the bit-flip signature does not correspond to the respective further bit-flip signature.

In various embodiments, the used ECC code may also be adapted to detect a given maximum number of incorrect bits, wherein the given maximum number of detectable incorrect bits corresponds to the given number of correctable incorrect bits plus one. For example, as mentioned before, the ECC code may be a SECDED code. In this case, the error detection circuit may be configured to set a second error signal to a given logic level in response to determining that the data bits and the ECC bits have the given maximum number of detectable incorrect bits.

In this case, the test circuit may also obtain a third pattern, wherein the third pattern corresponds to a given sequence of data bits and ECC bits having a given number of bits flipped with respect to the first pattern or the reference pattern, wherein the given number of flipped/inverted bits corresponds to the maximum number of detectable incorrect bits, wherein the third pattern represents a pattern with an uncorrectable error. The test circuit provides then the third pattern to the error detection circuit and verifies whether the first error signal is asserted, the second error signal is set to the given logic level and all bits of the bit-flip signature are de-asserted. Accordingly, the test circuit may assert the one or more error signals in response to determining that the first error signal is de-asserted, the second error signal is not set to the given logic level and/or at least one bit of the bit-flip signature is asserted.

In various embodiments, the same test circuit may test plural error correction circuits. Specifically, in various embodiments, the plurality of error detection circuits receives in parallel the sequence of patterns provided by the test circuit. In this case, a plurality of logic OR gates may be used to generate a first combined error signal and a first combined bit-flip signature by combining, respectively, the first error signals and the bit-flip signatures provided by the plurality of error detection circuit. Similarly, a plurality of logic AND gates may be used to generate a second combined error signal and a second combined bit-flip signature by combining, respectively, the first error signals and the bit-flip signatures provided by the plurality of error detection circuit.

In this case, the test circuit is configured to assert the one or more error signals when any of the combined error signals or combined bit-flip signature does not satisfy the previous verifications, i.e., the test circuit asserts the one or more error signal in response to determining that:

for the first pattern, the first combined error signal is asserted and/or at least one bit of the first combined bit-flip signature is asserted, and/or the second combined error signal is asserted and/or at least one bit of the second combined bit-flip signature is asserted, and/or for each of the second patterns, the first combined error signal is de-asserted and/or the first combined bit-flip signature does not correspond to the respective further bit-flip signature, and/or the second combined error signal is de-asserted and/or the second combined bit-flip signature does not correspond to the respective further bit-flip signature.

BRIEF DESCRIPTION OF THE DRAWINGS

Embodiments of the present disclosure will now be described with reference to the annexed drawings, which are provided purely by way of non-limiting example and in which:

FIG. 7 shows an embodiment of a processing system configured to generate ECC bits as a function of data bits;

FIG. 8 show an embodiment of a processing system configured to use ECC bits in order to detect and optionally correct errors in data bits;

DETAILED DESCRIPTION OF ILLUSTRATIVE EMBODIMENTS

Figure 1:
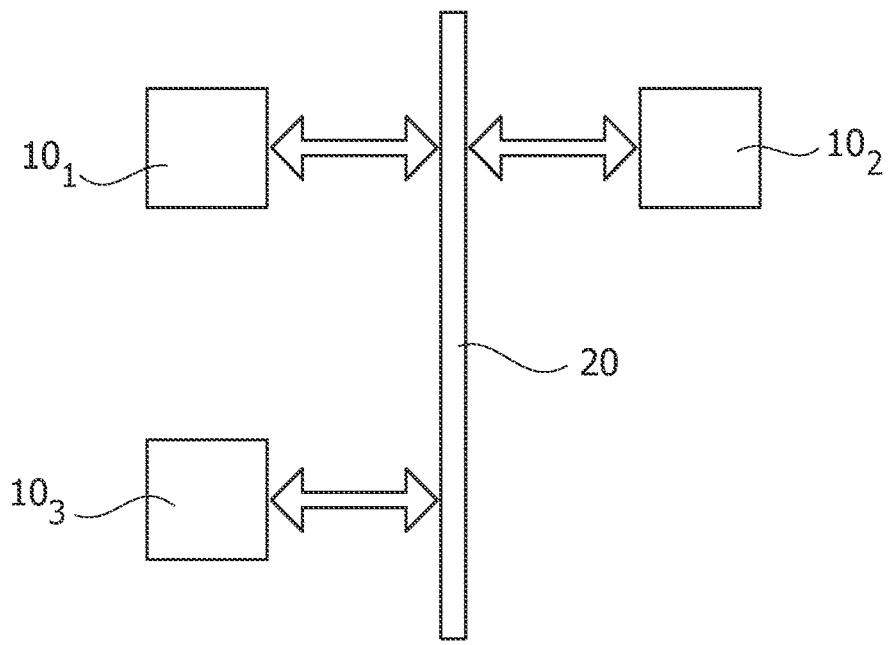
FIG. 1 shows an example of an electronic system comprising a plurality of processing systems.
Figure 2:
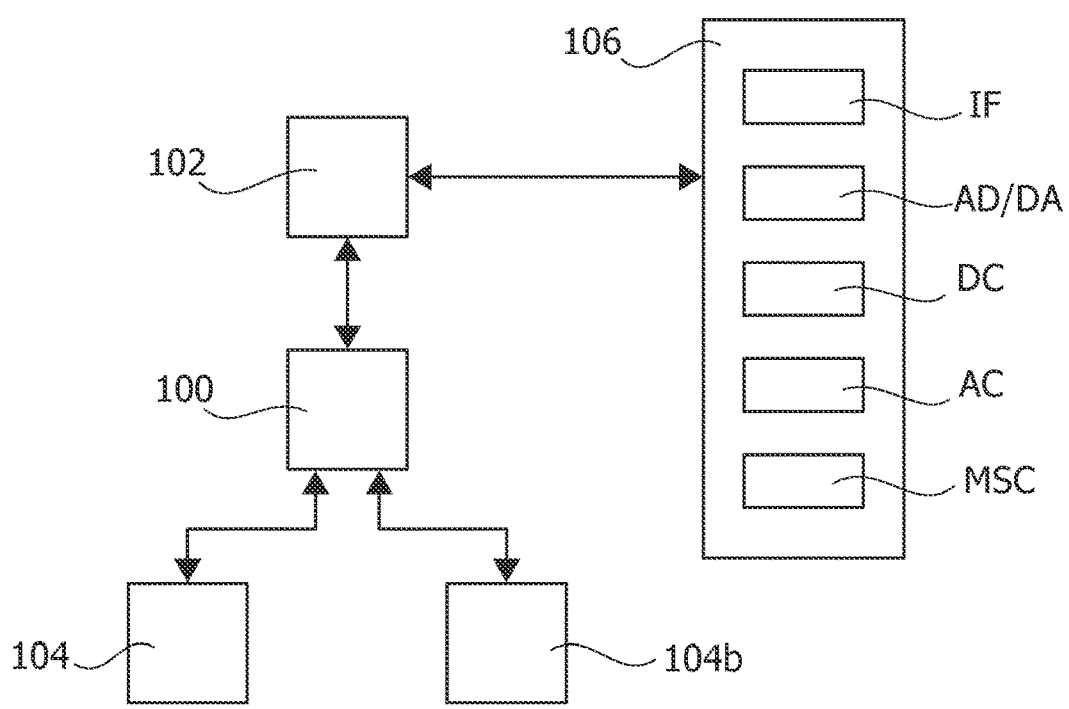
FIGS. 2 and 3 show examples of processing systems.
Figure 3:
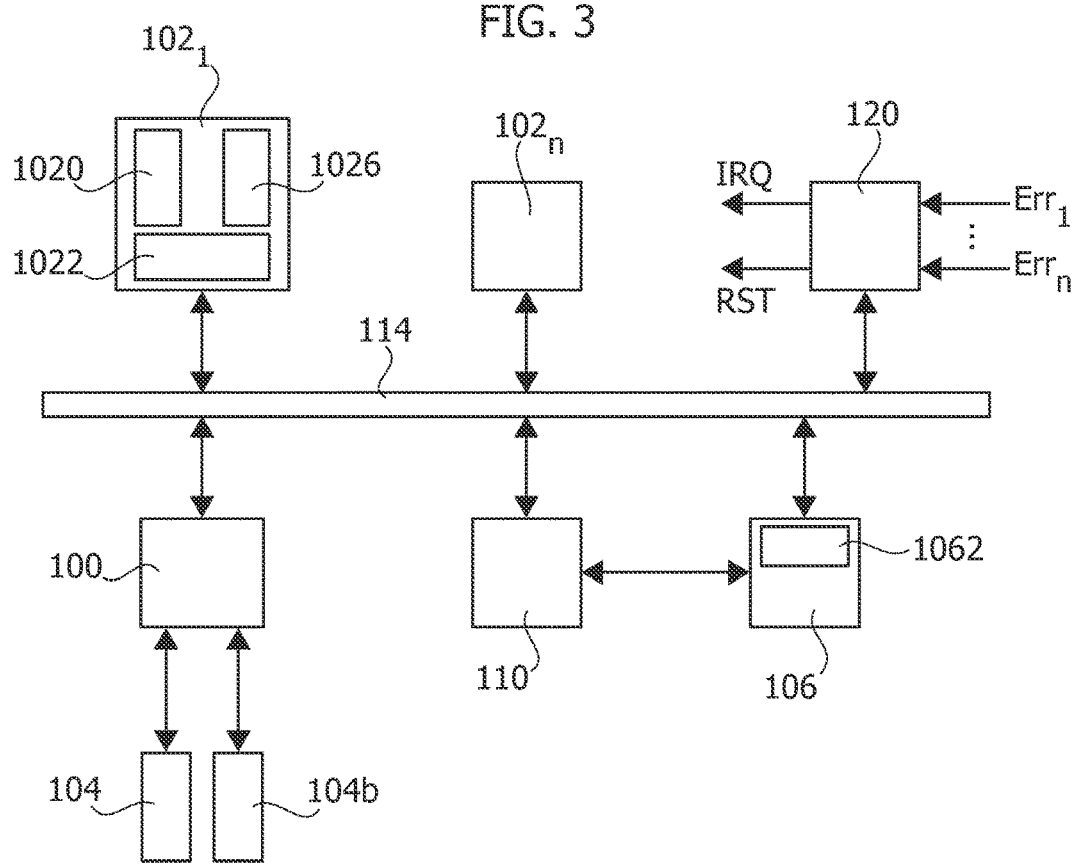
Figure 4:
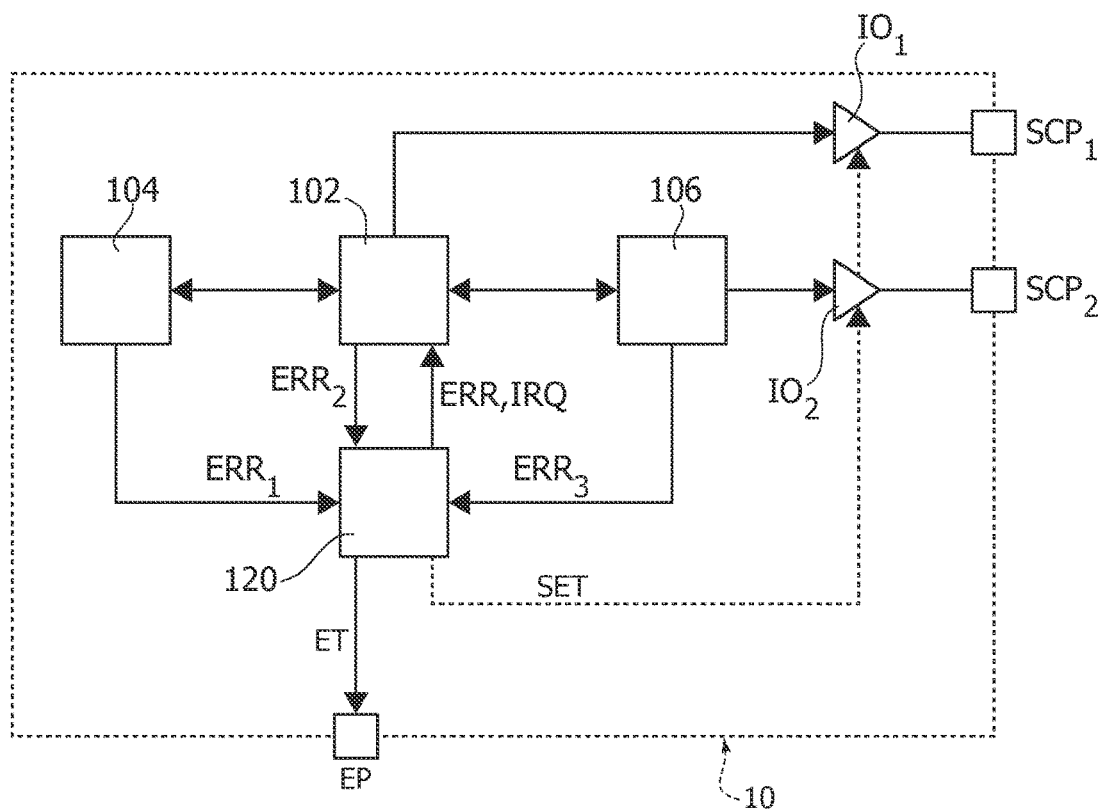
FIG. 4 shows an example of a processing system comprising a fault collection and error management circuit.

In the following description, numerous specific details are given to provide a thorough understanding of embodiments. The embodiments can be practiced without one or several specific details, or with other methods, components, materials, etc. In other instances, well-known structures, materials, or operations are not shown or described in detail to avoid obscuring aspects of the embodiments.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The headings provided herein are for convenience only and do not interpret the scope or meaning of the embodiments.

In the following FIGS. 7 to 13 parts, elements or components which have already been described with reference to FIGS. 1 to 6 are denoted by the same references previously used in such Figure; the description of such previously described elements will not be repeated in the following in order not to overburden the present detailed description.

As mentioned before, various embodiments of the present disclosure relate to a processing system configured to monitor the operation of a safety monitor circuit comprising an error detection circuit, i.e., a circuit configured to verify an error correction code (ECC). Specifically, various embodiments relate to a safety monitor circuit SMa configured to test such an ECC circuit.

FIG. 7 and FIG. 8 show a generic processing system boa comprising a master device 40 and a slave device 42, wherein the master device 40 and the slave device 42 use a conventional ECC protection scheme.

Specifically, in FIG. 7 the master circuit 40 transmits data DATA to the slave device 42. Specifically, the slave device 42 receives the data bits DATA and additional error correction code bits ECC generated by an error correction code generation circuit 44 configured to generate the bits ECC as a function of the data bits DATA.

For example, in various embodiments, the master device 40 may be a processing core 102, in particular a microprocessor 1020, or a DMA controller 110. Conversely, the slave device 42 may be a memory such as a non-volatile memory 104 or a volatile memory 104b, e.g., a RAM memory. For example, the error correction code generation circuit 44 may be integrated in the memory controller 100 of the memory 42. For a general description of these circuits, and a respective processing system 10, reference may be made to the previous description of FIGS. 1 to 3. For example, the microprocessor 1020 or DMA controller no (master device 40) may send a write request comprising the data DATA via the communication system 114 to the memory controller 100. The memory controller 100 may then calculate via the respective error correction code generation circuit 44 the bits ECC and write the data bits DATA and the bits ECC to the memory, e.g., to a memory address included in the write request.

Conversely, in FIG. 8 the master circuit 40 receives given data DATA from the slave device 42. Specifically, the slave device 42 provides the data bits DATA and the additional error correction code bits ECC.

For example, for this purpose, the microprocessor 1020 or DMA controller no (master device 40) may send a read request via the communication system 114 to the memory controller 100. The memory controller 100 may then read the data bits DATA and the bits ECC from the memory, e.g., from a memory address included in the read request, and transmit the data bits DATA to the microprocessor 1020 or DMA controller no.

However, as shown in FIG. 8, in this case, an error detection circuit 46 is configured to verify the bits DATA and ECC, and possibly generate one or more error signals ERR. For example, the one or more error signals ERR may be provided to the master circuit 40 and/or a fault collection and error management circuit 120. Reference may be made to the description of FIG. 4 to 6 in this respect.

For example, the error detection circuit 46 may be integrated in the memory controller 100. Specifically, in case of a simple error detection circuit 46, this circuit just verifies the correctness of the bits DATA and ECC. However, the error detection circuit 46 may also provide information concerning the position of the error, which thus may be used by an error correction circuit to correct errors in the data bits DATA. Generally, the error correction circuit may be integrated with the error detection circuit in an error detection and correction circuit 46, or the error correction circuit may be a separate circuit. Accordingly, the circuit 46 may indeed provide corrected data bits DATA to the master device 40.

Moreover, such ECC schemes may also be used for the communications exchanged via the communication system 114. For example, a bus master, such as the interface 1022 may add ECC bits to a request sent the communication system 1144. Accordingly, the receiving slave circuit, such as the slave interface 1062, may verify the ECC bits in order to detect errors in the transmitted request. Generally, such ECC bits may be verified via a respective error detection circuit for each of the address, data and control information of a request, or a combination of these information.

Generally, the number K of ECC bits depends on the number N of DATA bits and the ECC scheme, e.g., how many bits can be repaired. Thus, depending on the complexity of the implemented error correction code (ECC), the circuit 46 is able to detect up to a given number of flipped bits and eventually repair them. For example, in the field of micro-controllers adapted to be used in the automotive market, the adopted ECC scheme is usually able to detect up to two erroneous bits and repair one erroneous bit, so called Single-Error Correct (SEC) Double-Error Detect (DED) Code. For a general description of error detection and optionally correction codes, reference can be made to the corresponding webpage "Error detection and correction" of Wikipedia, e.g., the version of May 6, 2021, the content thereof being incorporated herein by reference.

As mentioned before, the solutions disclosed herein may be applied to any situation in which error correction code bits ECC are used, e.g., in the context of a SECDED Code, as it is, e.g., the case for an ARM Cortex R52 based microcontroller. For example, a possible implementation of a SECDED code is described in Application Note XAPP383 "Single Error Correction and Double Error Detection (SECDED) with CoolRunner-II™ CPLDs", v1.1, Aug. 1, 2003. Another possible error detection and correction circuit using a SECDED code is disclosed in document U.S. Pat. No. 8,381,083 B2. This document also discloses that the bits ECC may be calculated also for other data, e.g., for both the data DATA and the respective address.

Figure 9:
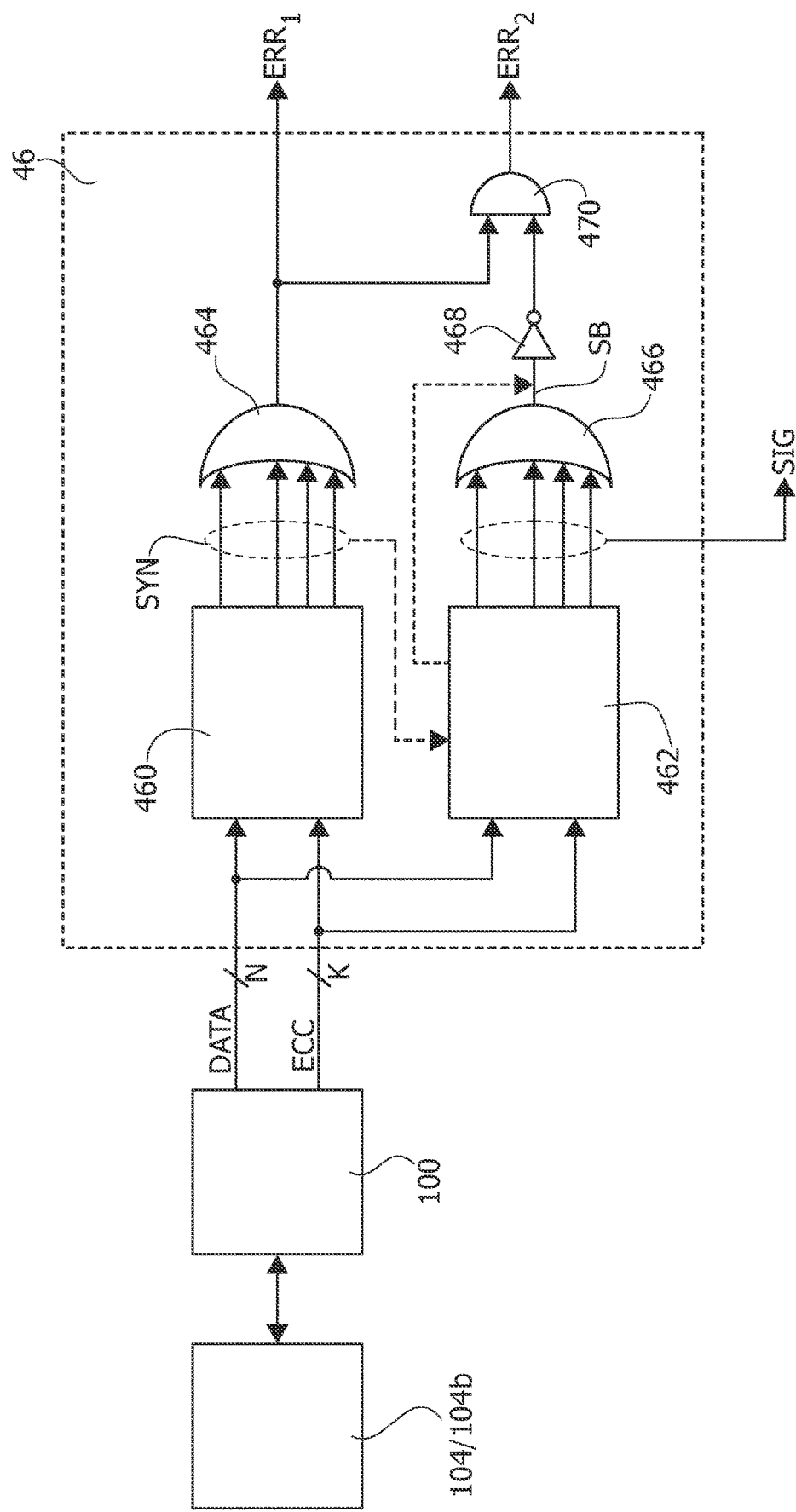
FIG. 9 shows an embodiment of an error detection circuit adapted to be used in the processing system of FIG. 8.

FIG. 9 shows in this respect an embodiment of error detection circuit 46 adapted to be used in a SECDED scheme, e.g., as used in an ARM Cortex R52 microcontroller.

Specifically, in the embodiment considered, the error detection circuit 46 comprises a syndrome calculation circuit 460 configured to:
receive the data bits DATA and ECC bits;
calculate the ECC bits for the received data bits DATA; and
compare the calculated ECC bits with the received ECC bits.

In case of a SEC code, the result of this comparison, called syndrome SYN, is indicative of the position of the incorrect bit in case of a single bit error. Accordingly, the syndrome SYN corresponds to a bit sequence having K bits.

Accordingly, in case the syndrome SYN is different from a bit sequence of K bits set to zero, i.e., different from the value 0, an error is detected. For example, this is schematically shown in FIG. 9, where a logic gate 464, such as a logic OR gate, is used to generate an error signal ERR, as a function of the syndrome SYN, i.e., the error signal $ERR_1$ is asserted when at least one of the bits of the syndrome SYN is asserted. However, in case of a SEC code, the syndrome calculation circuit 460 is unable to detect double-bit errors. In fact, the error signal ERR, will be asserted both for a single bit error and a double-bit error.

Accordingly, in various embodiments, the error correction code verification circuit 46 also comprises a circuit 462 configured to specifically detect single bit errors. For example, in the simplest case, the single bit error detection circuit 46 may verify an even or odd parity, thereby generating a signal SB indicating that a single bit error occurred. For example, in this case, the bits ECC may comprise one or more dedicated parity bits which may also not be provided to the syndrome calculation circuit 460.

However, often such single bit error detection circuit 462 are unable to distinguish between correct data and double bit-errors. Thus, by combining the error signal $ERR_1$ (indicating a single-bit error or double-bit error) and the signal SB (indicating a single bit error), it is possible to generate via a combinational logic circuit a signal $ERR_2$ indicating that a double-bit error occurred, e.g., by asserting the error signal $ERR_2$ when the error signal $ERR_1$ is asserted and the signal SB is de-asserted. For example, in the embodiment considered, the combinational logic circuit comprises an inverter 468 and a logic AND gate 470.

Accordingly, the error detection circuit 46 may be configured to use the syndrome SYN and the bit SB to generate a single-bit error signature SIG having N+K bits. For example, in the embodiment considered, this operation is implemented in the single bit error detection circuit 462.

Specifically, in case of a single-bit error, i.e., the signal SB is asserted, the circuit 46/462 is configured to assert the bit of the signal SIG corresponding to the position indicated by the syndrome SYN, while the other bits of the signal SIG are de-asserted.

In case the circuit 462 does not provide directly the signal SB, a corresponding signal SB may thus be generated via a logic combination of the bits of the signal SIG, e.g., via a logic OR gate 466, because at most only one of the bits of the signal SIG should be asserted.

Generally, also other ECC schemes may be used in order to generate the bit-flip signature SIG, which could also indicate that more than one bit should be flipped, e.g., in case of a Double-Error Correct code. Similarly, in this case, the error signals $ERR_1$ and $ERR_2$ could indicate in general that an error occurred (error signals $ERR_1$) and optionally that the error is correctable or not (error signals $ERR_2$).

Generally, these solutions have in common that the syndrome SYN is compared with a plurality of reference syndromes, wherein each reference syndrome corresponds to a given bit flip signature. Thus, in case the syndrome SYN corresponds to a reference syndrome, the error detection circuit may assert the respective bits of the error signature SIG. For example, in case of a SECDED code, the error detection circuit would use N+K reference syndromes, each corresponding to a respective single bit error. For example, the verification of the reference signatures and the setting of the signature SIG (and the error signals) may be implemented via a combinational logic circuit.

In this respect, by using a suitable SECDED ECC code, each reference syndrome associated with a single bit error may also have a unique pattern compared to double bit flip errors. Accordingly, in general, the error detection circuit may:

not signal an error (e.g., by de-asserting both error signals $ERR_1$ and $ERR_2$) when the bits of the syndrome SYN are all de-asserted;

a correctable error (e.g., by asserting the error signal $ERR_1$ and de-asserting the error signal $ERR_2$) when the syndrome SYN corresponds to one of the (e.g., single bit error) reference syndromes, also asserting the respective bits of the bit-flip signature SIG; and signal an uncorrectable error (e.g., by asserting the error signal ERR, and the error signal $ERR_2$) when at least one bit of the syndrome SYN is asserted and the syndrome SYN does not correspond to any of the reference syndromes.

Accordingly, in various embodiments, the signals $ERR_1$, $ERR_2$ and SIG may be provided to an error correction circuit, e.g., implemented in the memory controller 100, which thus may:

in case no error is signaled (e.g., the signal $ERR_1$ is de-asserted and the signal $ERR_2$ is de-asserted) provide the original data DATA to the requesting master device, e.g., by sending the data DATA to the communication system 114;

in case of a correctable bit error (e.g., the signal $ERR_1$ is asserted and the signal $ERR_2$ is de-asserted) flip the logic level of the respective bit(s), in particular in case of a data bit DATA, as indicated by the signature SIG, and provide the corrected data DATA to the requesting master device 40; and in case of an uncorrectable bit error (e.g., the signal $ERR_1$ is asserted and the signal $ERR_2$ is asserted), signal an error to the requesting master device and/or a fault collection and error management circuit 120.

Accordingly, in the embodiment considered, the error detection circuit 46 represents a safety monitor circuit. In this respect, the safety monitor circuit is indeed rather complex, and due to a malfunction of the circuit 46, errors in the data DATA may not be detected or errors may be signaled even when the data DATA are correct.

The inventors have thus observed that the operation of the circuit 46 should be verified. In this respect, the inventors have observed that the protection of a safety monitor circuit SM could be done with different strategies, e.g.:

by duplicating the safety monitor circuit 46 and verifying whether both circuits provide the same output, or by running some specific software aimed to stimulate the safety monitor functionality, e.g., by writing given data to the memory 104/104b and then reading the data again from the memory 104/104b.

Each of these solutions has its own advantage and disadvantage. For example, a duplication of the safety monitor circuit increases the device area and requires one or more safety monitor circuits to verify the consistency of the output signals generated by safety monitor and its redundant version. Conversely, a software test requires test development and verification and often it is not possible to verify the whole safety monitor circuit.

Moreover, the processing system boa could be configured to permit a LBIST (Logic Built-In Self-Test), which is a way to stimulate the internal nodes of the safety monitor circuit and verify the signals provided by the safety monitor circuit. However, such a LBIST solution requires an effort in the back-end development stage, which can consume resources and project time, as the LBIST coverage might be obtained only after several time-consuming trials. Moreover, the target coverage is usually obtained by inserting LBIST test points, which also means an increase in area.

Figure 10:
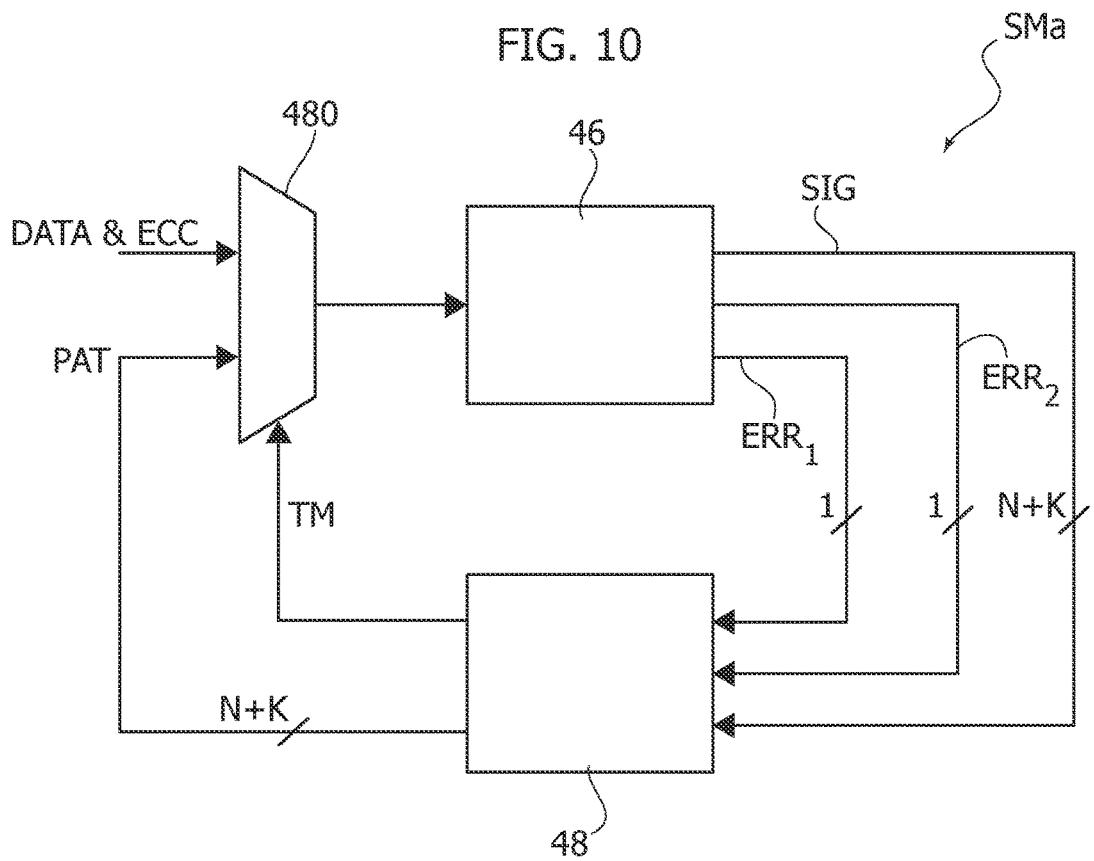
FIG. 10 shows an embodiment of a safety monitor circuit comprising an error detection circuit and a test circuit configured to test the error detection.

FIG. 10 shows an embodiment of a safety monitor circuit SMa according to the present disclosure.

Specifically, also in this case the safety monitor circuit comprises an error detection 46 configured to receive N data bits DATA and K ECC bits. Moreover, the error detection circuit 46 is configured to generate, as a function of the received bits DATA and ECC:

a plurality of error signals indicating whether an error occurred (e.g., the signal $ERR_1$) and whether the error may be corrected or not (e.g., the signal $ERR_2$); and a bit-flip signature SIG indicating, in case of a correctable error, which bit or bits of the data bits DATA and the ECC bits are incorrect and should thus be flipped/corrected.

As described in the foregoing, the error detection circuit 46 is usually a combinatorial logic circuit configured to generate the logic levels of the error signals and the bit-flip signature SIG as a function of the logic levels of the signals DATA and ECC.

Generally, in order to test the complete functionality of the circuit 46, all possible input combinations should be provided to the circuit 46. However, this is usually unfeasible, because too many logic combinations would need to be tested. However, the inventors have observed that it is usually sufficient that each input bit of the combinatorial logic is stimulated both with a logic zero and a logic one, and that each output of the combinatorial logic 46 is tested for a bit-change from zero to one or vice-versa.

Specifically, in various embodiments, the safety monitor circuit SMa comprises for this purpose a hardware test circuit 48 configured to:

generate a given bit-pattern PAT of N+K bits, which is selectively provided to the input DATA and ECC of the error detection circuit 46 during a test-mode, e.g., via a multiplexer 480 driven by the test circuit 48 via a test-mode signal TM, and receive and verify the resulting signals RES generated by the error detection circuit 46, i.e., the error signals and the signature SIG.

Figure 5:
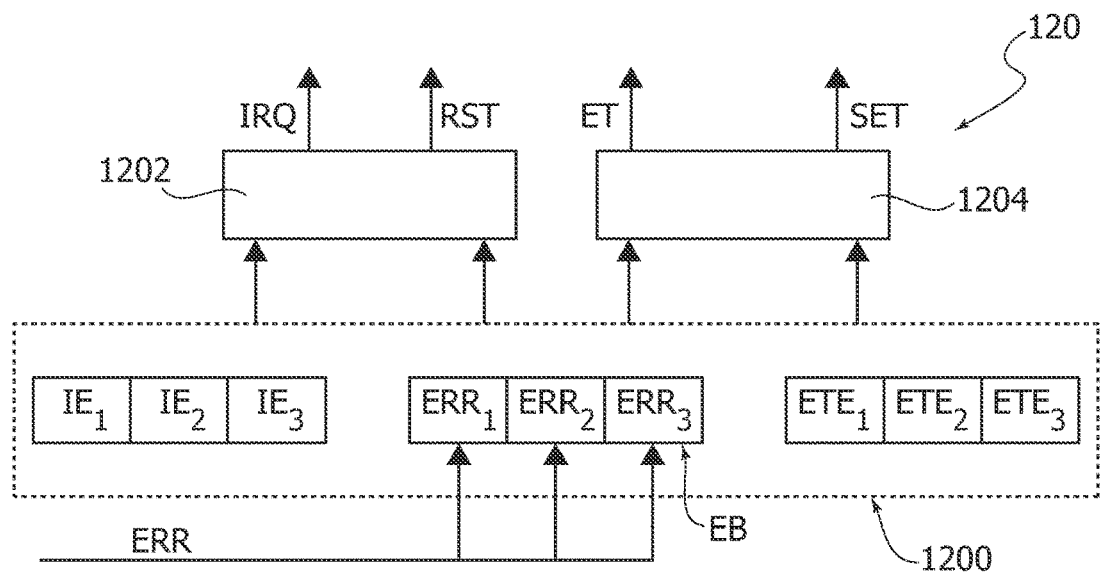
FIG. 5 shows an example of the fault collection and error management circuit of FIG. 4.
Figure 6:
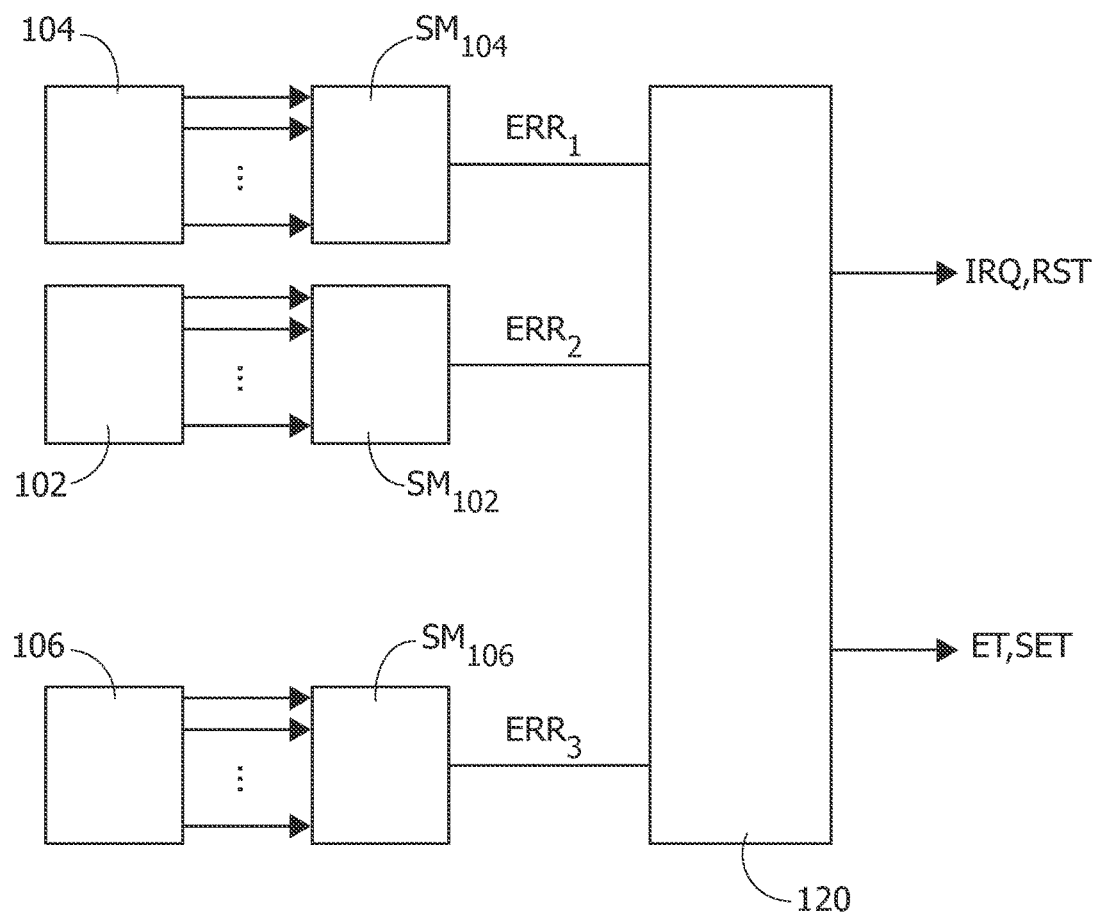
FIG. 6 shows an example of the connection between a plurality of safety monitoring circuits and the fault collection and error management circuit.

For example, the test-mode may be started when the processing system boa is powered-on and/or in response to given events, such as an error trigger ET signaled by the fault collection and error management circuit 120 (see, e.g., the description of FIG. 5).

As mentioned before, in various embodiments, the test circuit 48 is configured to generate a sequence of patterns PAT selected in order to ensure that, in case of a correct operating error detection circuit 46, each input and output of the error detection circuit 46 is at least one time set to zero and at least one time set to one. For example, in order to generate the sequence of patterns PAT and verify the respective result RES provided by the error detection circuit 46, the test circuit 48 may be a sequential logic circuit implementing a finite state machine.

Specifically, in various embodiments, the test circuit 48 is configured to generate three types of patterns:

one or more first/base patterns, which do not comprise an error in the bits DATA and ECC, i.e., the bits ECC correspond to the bits calculated for the data bits DATA according to the ECC scheme used by the error detection circuit 46;

a plurality of second patterns comprising correctable errors, such as a single bit flipped with respect to the first/base pattern; and optionally at least one third pattern comprising uncorrectable errors, such as two bits flipped with respect to the first/base pattern.

Thus, taking into account that all input bits have to be tested, in various embodiments, the test circuit 48 is configured to generate (at least) the following patterns PAT for a SECDED scheme:

a base pattern (with correct bits DATA and ECC);

N+K patterns, each of them containing in a different bit position a single bit flip with respect to the base pattern; and a pattern with two bits flipped with respect to the base pattern.

Accordingly, in various embodiments, the test circuit 48 is configured to determine for each of the above patterns the respective expected result and compare the expected result with the result RES received from the error detection circuit 46.

Accordingly, in various embodiments, the patterns generated by the test circuit 48 (and similarly the expected results) are predetermined. For example, this permits that the test circuit 48 is implemented with a sequential logic circuit, which either may generate a predetermined sequence of patterns or may obtain the patterns from a Read Only Memory (ROM). This also implies that no ECC encoder of the processing system boa has to be used to generate the patterns. In fact, such ECC encoders, e.g., implemented in the processing core(s) 102 may not be available during the self-test operation of the processing system boa. Specifically, in various embodiments, independently of the used ECC scheme, the patterns are selected in order to generate (at least) all possible single bit-flips for each input and output signal, and in particular for the DATA and ECC signals provided to the error detection circuit 46 and the bit flip signature SIG received from the error detection circuit 46. For example, for this purpose, the test circuit may generate predetermine patterns, which should test all possible (N+K) single bit-flip errors in the signature signal SIG.

Figure 11:
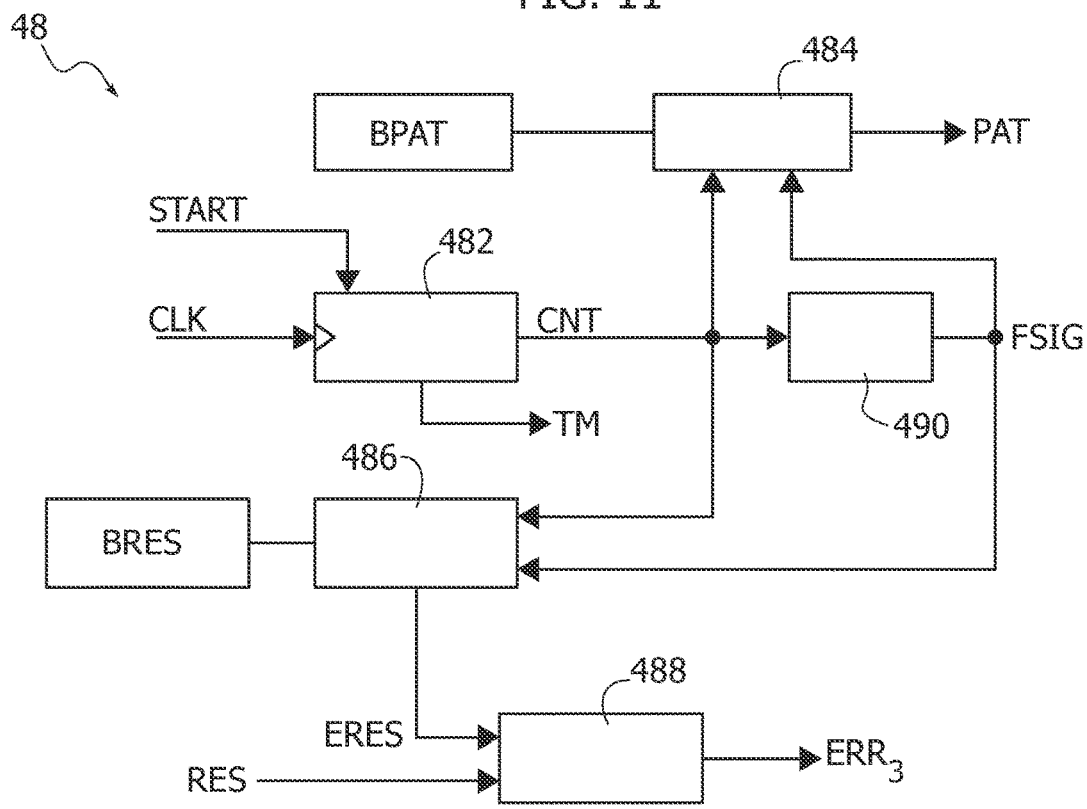
FIG. 11 shows an embodiment of the test circuit of FIG. 10.

FIG. 11 shows a possible embodiment of the test circuit 48.

Specifically, in the embodiment considered, instead of storing all patterns, the test circuit 48 just stores a base pattern BPAT. Specifically, the base pattern BPAT may be hardwired, or may be programmable, e.g., via a microprocessor 1020 or as a function of configuration data distributed via a hardware configuration module of the processing system boa.

Moreover, in the embodiment considered, the test circuit 48 comprises a digital hardware counter 482. Specifically, in various embodiments, the counter 482 is configured, when enabled (e.g., via a start signal START), to increase a count value CNT from an initial value to a maximum value corresponding to the number of patterns to be testes. For example, in this case, the test-mode signal TM may be asserted when the counter 482 is running.

Accordingly, in this case, the base pattern BPAT and count value CNT may be provided to a circuit 484 configured to generate the pattern PAT for the current cycle (as indicated by the count value CNT) to be provided to the error detection circuit 46 as a function of the base pattern BPAT and the count value CNT.

Similarly, in the embodiment considered, the test circuit 48 stores a base result BRES corresponding to the values of the signals (error signals and bit-flip signature SIG) expected to be provided by the error detection circuit 46 for the base pattern BPAT. For example, considering that the base pattern BPAT should not comprise errors, the base result BRES may have all bits set to low, e.g., via a hardwiring.

Accordingly, in this case, the base result BRES and the count value CNT may be provided to a circuit 488 configured to generate the expected result ERES for the current cycle (as indicated by the count value CNT) as a function of the base result BRES and the count value CNT. Accordingly, a digital comparator 488 may be configured to compare the expected result ERES with the result RES (i.e., the error signals and the signature SIG) provided by the error detection circuit 46, and assert an error signal $ERR_3$ in case the bit sequences do not correspond.

Specifically, in various embodiments, the test circuit 48 comprises a circuit 490 configured to generate a bit-flip signature FSIG indicating the position of the bits which should be flipped by the circuit 484 for the current test cycle.

Specifically, in various embodiments, when emulating a single-bit flip error, the count value CNT may be used to generate a one-hot encoded test signature FSIG. Alternatively, in order to test single bit errors, the circuit 490 may also comprise a shift register having a single bit set to high. Accordingly, such a shift register essentially represents a one-hot encoded counter, i.e., the circuits 482 and 490 may also be implemented with a single shift register/one-hot encoded counter, wherein the signature FSIG may correspond to a subset of the bits of the one-hot encoded counter.

Accordingly, in various embodiments, the signature FSIG indicates the position of the bits(s) to be flipped by the circuit 484. For example, in this case, the circuit 484 may be implemented with a plurality of XOR gates, each XOR gate receiving a respective bit of the base pattern BPAT and the signature FSIG. Generally, in case of a hardwired base pattern BPAT, also an optimized logic circuit may be used. Generally, instead of using the base pattern BPAT, the test circuit 48 may also obtain a different reference pattern without errors and generate the correctable patterns by combining the reference pattern with the signature FSIG.

In this respect, for correctable errors, the signature FSIG also corresponds to the expected signature SIG, i.e., the circuit 486 may use the signature FSIG to generate the expected result ERES.

In the following will now be described a possible embodiment of the patterns PAT generated by the test circuit 48, which, e.g., may be used for an ARM Cortex R52 based microcontroller. Specifically, in the embodiment considered, without lack of generality, the error detection circuit 46 is configured to receive N=64 data bits DATA and K=8 ECC bits, i.e., the patterns PAT have 72 bits.

For example, in various embodiments, all data bits of the base pattern BPAT are set to "0". In the ARM ECC scheme, this implies that the ECC bits are set to 0×3 for the base pattern BPAT. However, also any other base pattern (without errors) may be used. Accordingly, when providing the base pattern BPAT, the signature SIG and the error bits ERR1 and ERR2 (i.e., the result RES), should have all bits set to low, i.e., the base result BRES has all bits set to "0".

Next, the test circuit 48 may test the correctable bit errors, e.g., the N+K single bit errors in case of a SECDED scheme. As mentioned before, the circuit 490 may generate in this case the bit flip signature FSIG, which may be used to flip the respective bits of the base pattern BPAT or another reference pattern (without error).

For these patterns the test circuit 48 may verify whether the error signal ERR1 is asserted, the error signal ERR2 is de-asserted, and the signature SIG corresponds to the signature FSIG. For example, in the following will be assumed that the bits ECC correspond to the most-significant bits (MSB) of the signature SIG. Hereafter is the list of possible single bit patterns:

pattern $PAT$(data bit 0 flipped): DATA = 0×0000_0000_0000_0001, $$ECC = 0 \times 3;$$

expected result $ERES$: $ERR_{1=1}$, $ERR_{2=0}$, $$SIG = 0 \times 00\_0000\_0000\_0000\_0001;$$

pattern $PAT$(data bit 1 flipped): DATA = 0×0000_0000_0000_0002, $$ECC = 0 \times 3;$$

expected result $ERES$: $ERR_{1=1}$, $ERR_{2=0}$, $$SIG = 0 \times 00\_0000\_0000\_0000\_0002;$$

pattern $PAT$(data bit 2 flipped): DATA = 0×0000_0000_0000_0004, $$ECC = 0 \times 3;$$

expected result $ERES$: $ERR_{1=1}$, $ERR_{2=0}$, $$SIG = 0 \times 00\_0000\_0000\_0000\_0004;$$

...

pattern $PAT$(data bit 63 flipped): DATA = 0×8000_0000_0000_0000, $$ECC = 0 \times 3;$$

expected result $ERES$: $ERR_{1=1}$, $ERR_{2=0}$, $$SIG = 0 \times 00\_8000\_0000\_0000\_0000;$$

pattern $PAT$(ECC bit 0 flipped): DATA = 0×0000_0000_0000_0000, $$ECC = 0 \times 2;$$

expected result $ERES$: $ERR_{1=1}$, $ERR_{2=0}$, $$SIG = 0 \times 01\_0000\_0000\_0000\_0000;$$

pattern $PAT$(ECC bit 1 flipped): DATA = 0×0000_0000_0000_0000, $$ECC = 0 \times 1;$$

expected result $ERES$: $ERR_{1=1}$, $ERR_{2=0}$, $$SIG = 0 \times 02\_0000\_0000\_0000\_0000;$$

pattern $PAT$(ECC bit 2 flipped): DATA = 0×0000_0000_0000_0000, $$ECC = 0 \times 7;$$

expected result $ERES$: $ERR_{1=1}$, $ERR_{2=0}$, $$SIG = 0 \times 04\_0000\_0000\_0000\_0000;$$

...

pattern $PAT$(ECC bit 7 flipped): DATA = 0×0000_0000_0000_0000, $$ECC = 0 \times 83;$$

expected result $ERES$: $ERR_{1=1}$, $ERR_{2=0}$, $$SIG = 0 \times 80\_0000\_0000\_0000\_0000.$$

Figure 12:
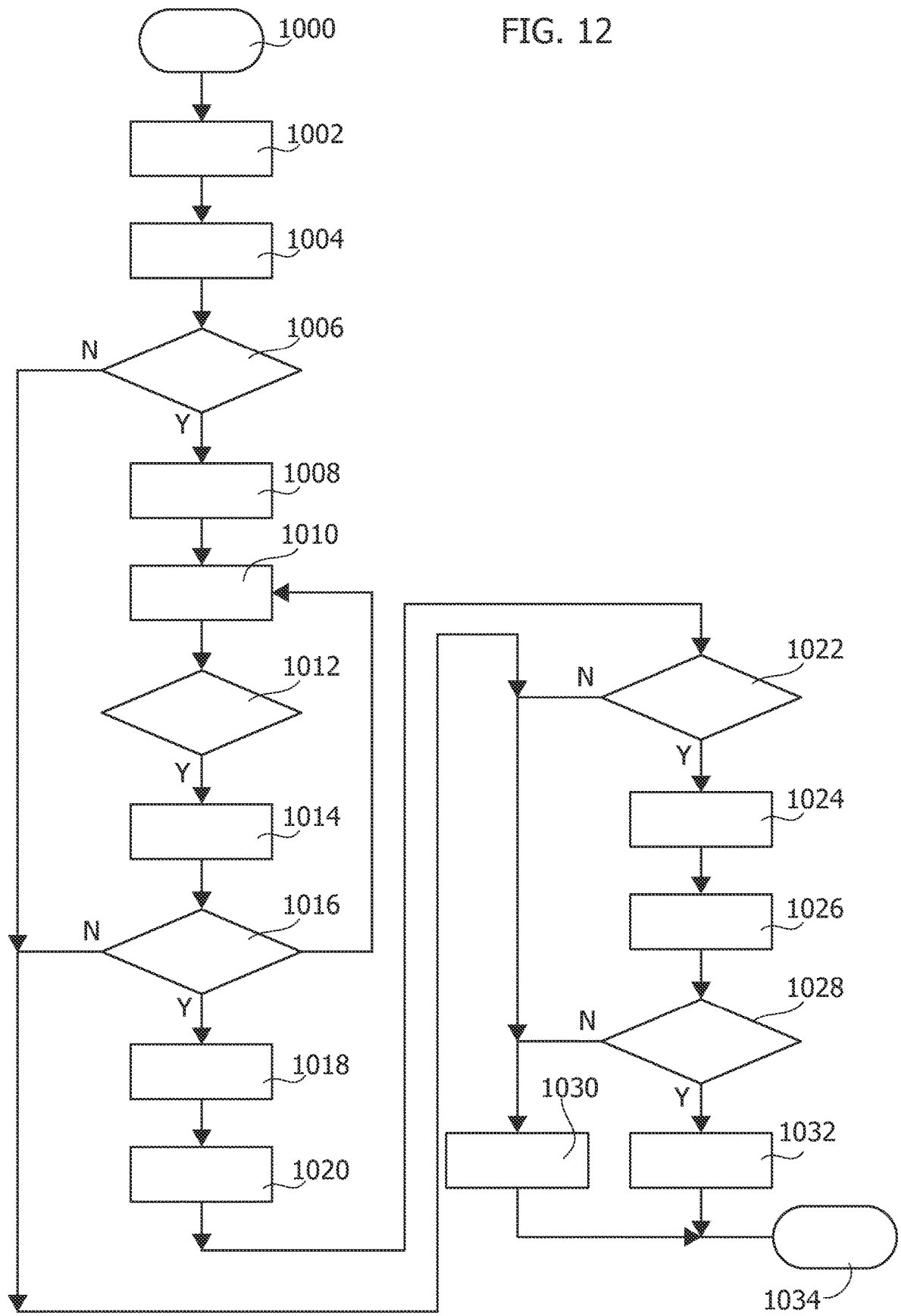
FIG. 12 shows an embodiment of the operation of the test circuit of FIG. 10.

Finally, the one or more uncorrectable error patterns may be generated by asserting the respective number of bits of the signal FSIG, i.e., flipping the respective bits of the pattern PAT, e.g., flipping two bits in case of a SECDED scheme. Alternatively, the uncorrectable error patterns may be fixed or programmable. For example, for these uncorrectable pattern(s), the test circuit 48 may verify whether the error signal $ERR_1$ is asserted, the error signal $ERR_2$ is asserted, and the signature SIG has all bits set to "0". For example, a possible double bit error pattern may be the following pattern PAT (data bit 0 flipped and ECC bit 0 flipped): DATA=0×0000_0000_0000_0001, ECC=0×2; expected result ERES: $ERR_1$=1, $ERR_2$=1, SIG=0× 00_0000_0000_0000_0000;

FIG. 12 shows in this respect an embodiment of the operation of the test circuit 48 in case of a SECDED scheme. Specifically, as described in the foregoing, in this case the test circuit 48 is configured to:

generate a first pattern without errors (e.g., the base pattern BPAT) and verify the result RES provided by the error detection circuit 46;

generate a sequence of second patterns with a single bit-flip and verify each time the result RES; and generate one or more third patterns with a double bit-flip and verify each time the result RES.

For example, the first/base pattern BPAT and the third/ double bit-flip pattern(s) may be fixed or programmable. Conversely, the second/single bit-flip pattern may be determined within the test circuit 48, e.g., via the circuit 490, and/or also the single bit-flip patterns may be fixed or programmable, and may thus also be independent from the base pattern BPAT. For example, as described in the foregoing, the test circuit 48 may be configured to generate the single bit-flip patterns, e.g., by inverting a respective bit of the base pattern BPAT as a function of the signature FSIG, wherein the signature FSIG may be generated via a shift register having set a single bit to high, or via a one-hot decoder of the count value CNT, or other similar digital solutions. Generally, the selection of the specific patterns may depend on the used ECC scheme and/or the specific implementation of the error detection circuit 46.

Accordingly, after a start step 1000, which is, e.g., activated in response to the start signal START, the test circuit 48 generates the base pattern at a step 1002 and provides at a step 1004 the base pattern to the error detection circuit 46. At a step 1006, the test circuit compares then the result RES provided by the error detection circuit 46 with the expected result ERES, e.g., verifies whether the error signals $ERR_1$ and $ERR_2$ are set to zero, and all bits of the signature SIG are set to zero.

In case the result RES does not correspond to the expected result ERES (output "N" of the verification step 1012), the test circuit 48 proceeds to the step 1030 where the test circuit asserts the error signal $ERR_3$, and the procedure terminates at a stop step 1034.

Conversely, in case the current single bit-flip pattern was the last single bit-flip pattern (output "Y" of the verification step 1016), the test circuit 48 generates the double bit-flip pattern at a step 1018 and provides at a step 1020 the double bit-flip pattern to the error detection circuit 46. Accordingly, at a step 1022, the test circuit compares then the result RES provided by the error detection circuit 46 with the expected result ERES, e.g., verifies whether the error signals $ERR_1$ and $ERR_2$ are set to one, and all bits of the signature SIG are set to zero.

In case the result RES does not correspond to the expected result ERES (output "N" of the verification step 1022), the test circuit 48 proceeds to the step 1030 where the test circuit asserts the error signal $ERR_3$, and the procedure terminates at a stop step 1034.

Conversely, in case the result RES corresponds to the expected result ERES (output "Y" of the verification step 1022), the test circuit 48 de-asserts at a step 1032 the error signal ERR$_2$, and the procedure terminates at a stop step 1034. Generally, the step 1032 is purely optional, because the error signal ERR$_2$ may also be de-asserted by default.

Accordingly, in case the current single bit-flip pattern was not the last single bit-flip pattern (output "N" of the verification step 1016), the test circuit 48 returns to the step 1010, where the test circuit provides the current single bit-flip pattern to the error detection circuit 46.

Conversely, in case the current single bit-flip pattern was the last single bit-flip pattern (output "Y" of the verification step 1016), the test circuit 48 generates the double bit-flip pattern at a step 1018 and provides at a step 1020 the double bit-flip pattern to the error detection circuit 46. Accordingly, at a step 1022, the test circuit compares then the result RES provided by the error detection circuit 46 with the expected result ERES, e.g., verifies whether the error signals ERR1 and ERR2 are set to one, and all bits of the signature SIG are set to zero.

In case the result RES does not correspond to the expected result ERES (output "N" of the verification step 1022), the test circuit 48 proceeds to the step 1030 where the test circuit asserts the error signal ERR3, and the procedure terminates at a stop step 1034.

Conversely, in case the result RES corresponds to the expected result ERES (output "Y" of the verification step 1022), the test circuit 48 de-asserts at a step 1032 the error signal ERR2, and the procedure terminates at a stop step 1034. Generally, the step 1032 is purely optional, because the error signal ERR2 may also be de-asserted by default.

Generally, the test circuit 48 may also test plural double bit-flip patterns. For example, as shown in FIG. 12, in case the result RES corresponds to the expected result ERES (output "Y" of the verification step 1022), the test circuit 48 may generate a further double bit-flip pattern at a step 1024 and provide at a step 1026 the further double bit-flip pattern to the error detection circuit 46. Accordingly, at a step 1028, the test circuit may then compare the result RES provided by the error detection circuit 46 with the expected result ERES, e.g., may verify whether the error signals ERR$_1$ and ERR$_2$ are set to one, and all bits of the signature SIG are set to zero.

In case the result RES does not correspond to the expected result ERES (output "N" of the verification step 1028), the test circuit 48 proceeds to the step 1030 where the test circuit asserts the error signal ERR$_3$, and the procedure terminates at a stop step 1034.

Conversely, in case the result RES corresponds to the expected result ERES (output "Y" of the verification step 1028), the test circuit 48 proceeds to the step 1032 or directly the stop step 1034.

Figure 13:
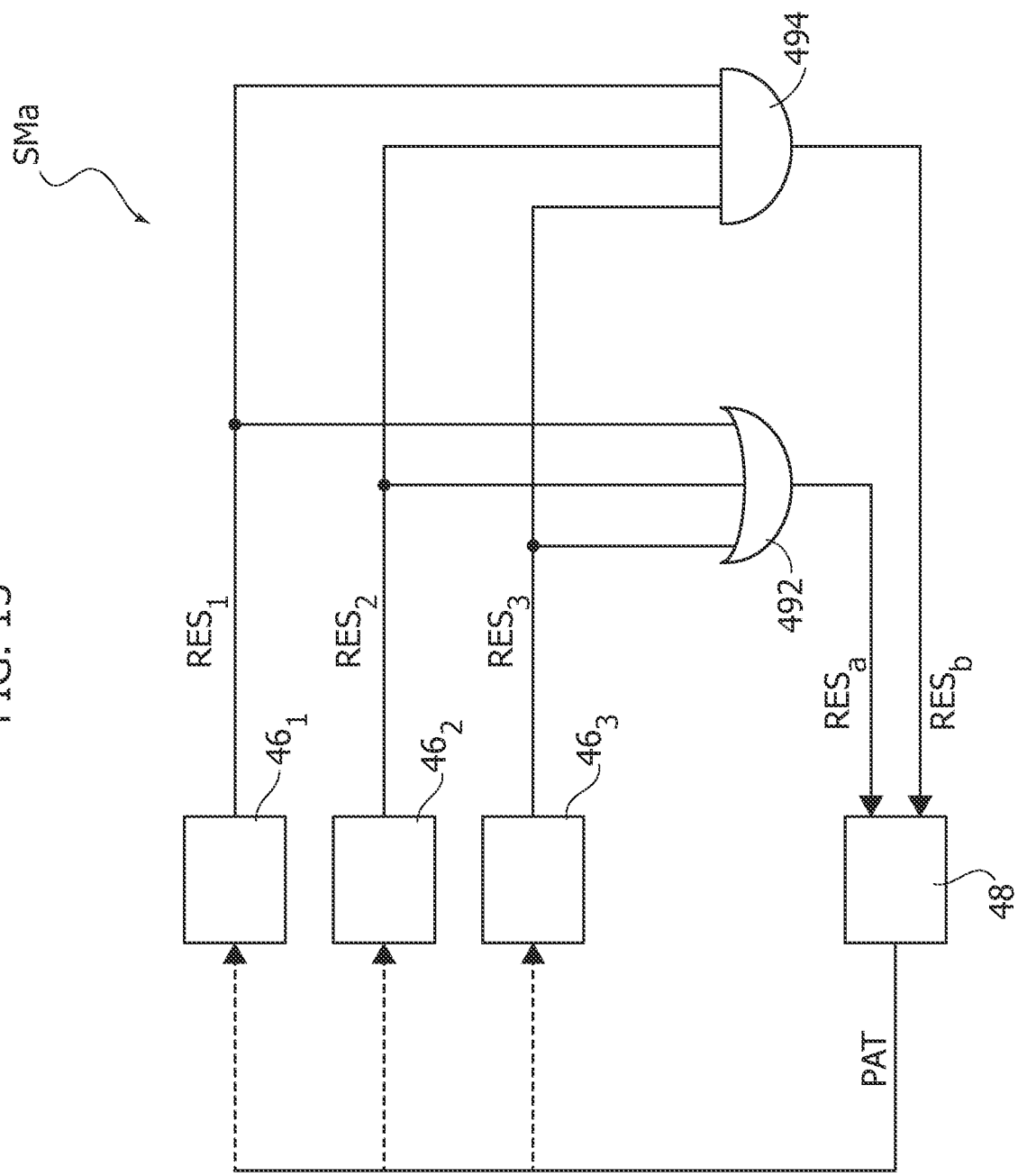
FIG. 13 shows a second embodiment of a test circuit configured to test a plurality of error detection circuit.

FIG. 13 shows a further embodiment, wherein the same test circuit 48 is configured to test plural error detection circuit 46, such as error detection circuits 461, 462 and 463.

Generally, in this case, the test circuit 48 may be connected, e.g., via multiplexers sequentially to one of the error detection circuits 461, 462 and 463.

Conversely, in FIG. 13, the test circuit 48 provided the same pattern PAT in parallel to all the error detection circuits 461, 462 and 463. Specifically, in the embodiment considered, the results RES$_1$, RES$_2$ and RES$_3$ provided the error detection circuits 46$_1$, 46$_2$ and 46$_3$ are combined via a logic OR gate 492 to generate a first result signal RES$_a$ and via a logic AND gate 492 to generate a second result signal RES$_b$. Specifically, in case the error detection circuits 46$_1$, 46$_2$ and 46$_3$ operate correctly, both the first result signal RES$_a$ and the second result signal RES$_b$ should correspond to the previously described expected result ERES. Accordingly in various embodiments, the test circuit may be configured to compare each of the first result signal RES$_a$ and the second result signal RES$_b$ with the expected result signal ERES.

Accordingly, the previous solutions permit to test an ECC error detection circuit 46. The described solution is executed in hardware, with a minimal execution time, minimal area overhead, and possibly without any software intervention. This reduces the complexity and cost associated with the protection of the safety monitor logic done with traditional approaches, such as duplication, or software tests. Moreover, no specific tool has to be used to instantiate a back-end LBIST test structures, which is usually a very complex and time-consuming operation. Conversely, the solution disclosed herein is a front-end solution and, as such, can be easily instantiated.

Of course, without prejudice to the principle of the invention, the details of construction and the embodiments may vary widely with respect to what has been described and illustrated herein purely by way of example, without thereby departing from the scope of the present invention, as defined by the ensuing claims.

What is claimed is:

1. A processing system comprising:
a circuit configured to provide a given number N of data bits and a given number K of Error Correction Code (ECC) bits;
an error detection circuit configured to:
receive the data bits and the ECC bits;
calculate further ECC bits as a function of the data bits according to a given ECC scheme;
generate a syndrome by comparing the calculated ECC bits with the received ECC bits, wherein the syndrome has K bits;
compare the syndrome with a plurality of N+K single bit-flip reference syndromes, wherein each single bit-flip reference syndrome is associated with a respective single bit-flip error; and
in response to determining that the syndrome corresponds to a single bit-flip reference syndrome:
assert a first error signal; and
assert one bit of a bit-flip signature corresponding to the single bit-flip error indicated by the respective single bit-flip reference syndrome, wherein the bit-flip signature has a given number N+K bits and indicates a position of one or more incorrect bits in the data bits and ECC bits; and
a test circuit configured to:
provide, during a test-mode, a sequence of patterns to the error detection circuit, each pattern comprising data bits and ECC bits, and monitor the respective first error signal and bit-flip signature;
obtain a first pattern, the first pattern corresponding to a given sequence of data bits and ECC bits calculated as a function of the given data bits according to the given ECC scheme;
provide the first pattern to the error detection circuit and verify whether the first error signal is de-asserted and all bits of the bit-flip signature are de-asserted;
obtain a sequence of N+K further bit-flip signatures, each further bit-flip signature having asserted a single bit;
obtain for each further bit-flip signature a respective second pattern, wherein each second pattern corresponds to a pattern having a single bit flipped with respect to a reference pattern at positions of the single asserted bit of the respective further bit-flip signature, wherein the reference pattern corresponds to a given sequence of data bits and ECC bits calculate as a function of the respective data bits according to the given ECC scheme, wherein each second pattern corresponds to a pattern with a correctable single bit error;

provide each of the second patterns to the error detection circuit and verify whether the first error signal is asserted and the bit-flip signature corresponds to the respective further bit-flip signature; and assert one or more error signals in response to determining that:

for the first pattern, the first error signal is asserted and/or at least one bit of the bit-flip signature is asserted; and/or for each of the second patterns, the first error signal is de-asserted and/or the bit-flip signature does not correspond to the respective further bit-flip signature.

2. The processing system according to claim 1, wherein the reference pattern for the second patterns corresponds to the first pattern.

3. The processing system according to claim 1, wherein the ECC scheme is configured to detect a given maximum number of incorrect bits, the given maximum number of detectable incorrect bits corresponding to the given number of correctable incorrect bits plus one, wherein the error detection circuit is configured to set a second error signal to a given logic level in response to determining that the data bits and the ECC bits have the maximum number of detectable incorrect bits, and wherein the test circuit is configured to:

obtain a third pattern, the third pattern corresponding to a given sequence of data bits and ECC bits having a given number of bits flipped with respect to the first pattern or the reference pattern, the given number of flipped bits corresponding to the maximum number of detectable incorrect bits, wherein the third pattern represents a pattern with an uncorrectable error;

provide the third pattern to the error detection circuit and verify whether the first error signal is asserted, the second error signal is set to the given logic level and all bits of the bit-flip signature are de-asserted;

assert the one or more error signals in response to determining that the first error signal is de-asserted, the second error signal is not set to the given logic level and/or at least one bit of the bit-flip signature is asserted.

4. The processing system according to claim 3, wherein the ECC scheme is a Single-Error Correct Double-Error Detect Code.

5. The processing system according to claim 1, wherein the test circuit is configured to generate the N+K second patterns by performing the following steps for each second pattern:

obtaining the reference pattern;

generating the respective further bit-flip signature (FSIG), the further bit-flip signature having asserted a single bit; and generating the respective second pattern by inverting the bit of the reference pattern for which the corresponding bit of the further bit-flip signature is asserted.

6. The processing system according to claim 5, wherein the test circuit is configured to generate the further bit-flip signature via:

a counter and a one-hot decoder; or
a shift register having a single bit asserted.

7. The processing system according to claim 1, wherein the circuit comprises an error correction circuit configured to:

when the first error signal is asserted, generate corrected data bits by inverting each bit of the data bits for which the corresponding bit of the bit-flip signature is asserted.

8. The processing system according to claim 1, wherein the processing system comprises a microprocessor and/or a direct memory access (DMA) controller, and wherein the circuit is a memory controller configured to:

receive a read request from the microprocessor and/or the DMA controller, the read request comprising a given address;

read the given number N of data bits and the given number K of ECC bits from the given address of a memory;

when the first error signal is de-asserted, provide the data bits to the microprocessor and/or the DMA controller; and when the first error signal is asserted, provide the corrected data bits to the microprocessor and/or the DMA controller.

9. The processing system according to claim 1, comprising:

a plurality of error detection circuits, wherein the plurality of error detection circuits is configured to receive in parallel the sequence of patterns;

logic OR gates configured to generate a first combined error signal and a first combined bit-flip signature by combining the first error signals and the bit-flip signatures provided by the plurality of error detection circuit;

logic AND gates configured to generate a second combined error signal and a second combined bit-flip signature by combining the first error signals and the bit-flip signatures provided by the plurality of error detection circuit;

wherein the test circuit is configured to assert the one or more error signals in response to determining that:

for the first pattern, the first combined error signal is asserted and/or at least one bit of the first combined bit-flip signature is asserted, and/or the second combined error signal is asserted and/or at least one bit of the second combined bit-flip signature is asserted; and/or for each of the second patterns, the first combined error signal is de-asserted and/or the first combined bit-flip signature does not correspond to the respective further bit-flip signature, and/or the second combined error signal is de-asserted and/or the second combined bit-flip signature does not correspond to the respective further bit-flip signature.

10. The processing system according to claim 1, wherein the processing system is disposed on an integrated circuit.

11. An apparatus comprising:

a communication system connecting a plurality of processing systems; and the processing systems, wherein each of the processing systems comprises:

a circuit configured to provide a given number N of data bits and a given number K of Error Correction Code (ECC) bits;

an error detection circuit configured to:

receive the data bits and the ECC bits;

calculate further ECC bits as a function of the data bits according to a given ECC scheme;

generate a syndrome by comparing the calculated ECC bits with the received ECC bits, wherein the syndrome has K bits;

compare the syndrome with a plurality of N+K single bit-flip reference syndromes, wherein each single bit-flip reference syndrome is associated with a respective single bit-flip error; and in response to determining that the syndrome corresponds to a single bit-flip reference syndrome:
assert a first error signal; and
assert one bit of a bit-flip signature corresponding to the single bit-flip error indicated by the respective single bit-flip reference syndrome, wherein the bit-flip signature has a given number N+K bits and indicates a position of one or more incorrect bits in the data bits and ECC bits; and a test circuit configured to:
provide, during a test-mode, a sequence of patterns to the error detection circuit, each pattern comprising data bits and ECC bits, and monitor the respective first error signal and bit-flip signature;
obtain a first pattern, the first pattern corresponding to a given sequence of data bits and ECC bits calculated as a function of the given data bits according to the given ECC scheme;
provide the first pattern to the error detection circuit and verify whether the first error signal is de-asserted and all bits of the bit-flip signature are de-asserted;
obtain a sequence of N+K further bit-flip signatures, each further bit-flip signature having asserted a single bit;
obtain for each further bit-flip signature a respective second pattern, wherein each second pattern corresponds to a pattern having a single bit flipped with respect to a reference pattern at positions of the single asserted bit of the respective further bit-flip signature, wherein the reference pattern corresponds to a given sequence of data bits and ECC bits calculate as a function of the respective data bits according to the given ECC scheme, wherein each second pattern corresponds to a pattern with a correctable single bit error;
provide each of the second patterns to the error detection circuit and verify whether the first error signal is asserted and the bit-flip signature corresponds to the respective further bit-flip signature; and
assert one or more error signals in response to determining that:
for the first pattern, the first error signal is asserted and/or at least one bit of the bit-flip signature is asserted; and/or
for each of the second patterns, the first error signal is de-asserted and/or the bit-flip signature does not correspond to the respective further bit-flip signature.

12. The apparatus of claim 11, wherein the apparatus is a vehicle.

13. A method of operating a processing system comprising a circuit configured to provide a given number N of data bits and a given number K of Error Correction Code (ECC) bits, an error detection circuit, and a test circuit, the method comprising:
receiving, by the error detection circuit, the data bits and the ECC bits;

calculating, by the error detection circuit, further ECC bits as a function of the data bits according to a given ECC scheme;

generating, by the error detection circuit, a syndrome by comparing the calculated ECC bits with the received ECC bits, wherein the syndrome has K bits;

comparing, by the error detection circuit, the syndrome with a plurality of N+K single bit-flip reference syndromes, each single bit-flip reference syndrome being associated with a respective single bit-flip error;

in response to determining that the syndrome corresponds to a single bit-flip reference syndrome:
asserting, by the error detection circuit, a first error signal; and
asserting, by the error detection circuit, one bit of a bit-flip signature corresponding to the single bit-flip error indicated by the respective single bit-flip reference syndrome, the bit-flip signature having a given number N+K bits and indicating a position of one or more incorrect bits in the data bits and ECC bits;

providing, by the test circuit during a test-mode, a sequence of patterns to the error detection circuit, each pattern comprising data bits and ECC bits, and monitoring the respective first error signal and bit-flip signature;

obtaining, by the test circuit, a first pattern, the first pattern corresponding to a given sequence of data bits and ECC bits calculated as a function of the given data bits according to the given ECC scheme;

providing, by the test circuit, the first pattern to the error detection circuit;

verifying, by the test circuit, whether the first error signal is de-asserted and all bits of the bit-flip signature are de-asserted;

obtaining, by the test circuit, a sequence of N+K further bit-flip signatures, each further bit-flip signature having asserted a single bit;

obtaining, by the test circuit, for each further bit-flip signature, a respective second pattern, each second pattern corresponding to a pattern having a single bit flipped with respect to a reference pattern at positions of the single asserted bit of the respective further bit-flip signature, the reference pattern corresponding to a given sequence of data bits and ECC bits calculate as a function of the respective data bits according to the given ECC scheme, and each second pattern corresponding to a pattern with a correctable single bit error;

providing, by the test circuit, each second pattern to the error detection circuit;

verifying, by the test circuit, whether the first error signal is asserted and the bit-flip signature corresponds to the respective further bit-flip signature;

asserting, by the test circuit, one or more error signals in response to determining that:
for the first pattern, the first error signal is asserted and/or at least one bit of the bit-flip signature is asserted; and/or
for each of the second patterns, the first error signal is de-asserted and/or the bit-flip signature does not correspond to the respective further bit-flip signature.

14. The method according to claim 13, wherein the reference pattern for the second patterns corresponds to the first pattern.

15. The method according to claim 13, wherein the ECC scheme is configured to detect a given maximum number of incorrect bits corresponding to the given number of correctable incorrect bits plus one, and the method further comprises:

setting, by the error detection circuit, a second error signal to a given logic level in response to determining that the data bits and the ECC bits have the maximum number of detectable incorrect bits;

obtaining, by the test circuit, a third pattern, the third pattern corresponding to a given sequence of data bits and ECC bits having a given number of bits flipped with respect to the first pattern or the reference pattern, the given number of flipped bits corresponding to the maximum number of detectable incorrect bits, the third pattern representing a pattern with an uncorrectable error;

providing, by the test circuit, the third pattern to the error detection circuit and verifying whether the first error signal is asserted, the second error signal being set to the given logic level and all bits of the bit-flip signature being de-asserted; and asserting, by the test circuit, the one or more error signals in response to determining that the first error signal is de-asserted, the second error signal not being set to the given logic level and/or at least one bit of the bit-flip signature being asserted.

16. The method according to claim 15, wherein the ECC scheme is a Single-Error Correct Double-Error Detect Code.

17. The method according to claim 13, further comprising the test circuit generating the N+K second patterns by performing the following steps for each second pattern:

obtaining the reference pattern;

generating the respective further bit-flip signature (FSIG), the further bit-flip signature having asserted a single bit; and generating the respective second pattern by inverting the bit of the reference pattern for which the corresponding bit of the further bit-flip signature is asserted.

18. The method according to claim 13, further comprising:

in response to the first error signal being asserted, generating, by an error correction circuit, corrected data bits by inverting each bit of the data bits for which the corresponding bit of the bit-flip signature is asserted.

19. The method according to claim 13, wherein the processing system further comprises a microprocessor and/or a direct memory access (DMA) controller, and the method further comprises:

receiving a read request from the microprocessor and/or the DMA controller, the read request comprising a given address;

reading the given number N of data bits and the given number K of ECC bits from the given address of a memory; and in response to the first error signal being de-asserted, providing the data bits to the microprocessor and/or the DMA controller.

20. The method according to claim 13, wherein the processing system further comprises a microprocessor and/or a direct memory access (DMA) controller, and the method further comprises:

receiving a read request from the microprocessor and/or the DMA controller, the read request comprising a given address;

reading the given number N of data bits and the given number K of ECC bits from the given address of a memory; and in response to the first error signal being asserted, providing the corrected data bits to the microprocessor and/or the DMA controller.

* * * * *

UNITED STATES PATENT AND TRADEMARK OFFICE
CERTIFICATE OF CORRECTION

PATENT NO. : 12,068,048 B2
APPLICATION NO. : 17/815807
DATED : August 20, 2024
INVENTOR(S) : Vivek Mohan Sharma and Roberto Colombo It is certified that error appears in the above-identified patent and that said Letters Patent is hereby corrected as shown below:

In the Claims

In Column 20-21, Lines 67-1, Claim 1:
Change "ECC bits calculate as a function of the respective data bits"
To --ECC bits calculated as a function of the respective data bits--

In Column 23, Line 41, Claim 11:
Change "ECC bits calculate as a function of the respective data bits"
To --ECC bits calculated as a function of the respective data bits--

In Column 24, Line 45, Claim 13:
Change "ECC bits calculate as a function of the respective data bits"
To --ECC bits calculated as a function of the respective data bits--

Signed and Sealed this
Eighth Day of October, 2024

Katherine Kelly Vidal
*Director of the United States Patent and Trademark Office*